United States Patent
Ozawa et al.

(10) Patent No.: US 7,043,202 B2
(45) Date of Patent: May 9, 2006

(54) FREQUENCY MODULATOR APPARATUS OF PHASE SELECTION TYPE, AND FREQUENCY SYNTHESIZER OF PHASE SELECTION TYPE

(75) Inventors: Seiichi Ozawa, Tokyo (JP); Junichi Okamura, Tokyo (JP)

(73) Assignee: Thine Electronics, Inc., Tokyo (JP)

( * ) Notice: Subject to any disclaimer, the term of this patent is extended or adjusted under 35 U.S.C. 154(b) by 0 days.

(21) Appl. No.: 10/537,472

(22) PCT Filed: Dec. 8, 2003

(86) PCT No.: PCT/JP03/15665

§ 371 (c)(1),
(2), (4) Date: Jun. 3, 2005

(87) PCT Pub. No.: WO2004/053669

PCT Pub. Date: Jun. 24, 2004

(65) Prior Publication Data

US 2006/0025094 A1    Feb. 2, 2006

(30) Foreign Application Priority Data

Dec. 6, 2002  (JP) .............................. 2002-355673
Dec. 3, 2003  (JP) .............................. 2003-404109

(51) Int. Cl.
*H04B 7/165*    (2006.01)
*H04B 1/00*     (2006.01)
(52) U.S. Cl. .................... 455/23; 455/42; 455/205; 332/117; 375/371
(58) Field of Classification Search .............. 455/23, 455/42, 63.1, 67.13, 205, 255, 260; 332/100, 332/103, 117, 144; 375/271, 279, 302, 308, 375/322, 327, 329, 354, 371, 373, 376
See application file for complete search history.

(56) References Cited

U.S. PATENT DOCUMENTS

| 3,835,404 | A * | 9/1974 | Nakamura et al. .......... 375/371 |
| 4,023,103 | A * | 5/1977 | Malm .......................... 455/62 |
| 4,229,825 | A * | 10/1980 | Guidoux ..................... 375/371 |
| 6,876,710 | B1 * | 4/2005 | Pitzer et al. ................ 375/371 |
| 2004/0196939 | A1 * | 10/2004 | Co .............................. 375/376 |
| 2005/0135505 | A1 * | 6/2005 | Ebuchi et al. .............. 375/308 |

FOREIGN PATENT DOCUMENTS

| JP | 4-190409 A | 7/1992 |
| JP | 5-152908 A | 6/1993 |
| JP | 7-122094 A | 5/1995 |
| JP | 2001-148690 A | 5/2001 |
| JP | 2001-331236 A | 11/2001 |
| JP | 2002-366250 A | 12/2002 |
| WO | WO 00/45246 A | 8/2000 |

* cited by examiner

*Primary Examiner*—Quochien B. Vuong
(74) *Attorney, Agent, or Firm*—Sughrue Mion, PLLC

(57) ABSTRACT

A phase-selective type frequency modulator capable of easing the restriction on a phase range of a modulated clock signal. The phase-selective type frequency modulator includes a multiphase clock signal generating circuit 101 for generating N-phase clock signals; a control circuit 104 for sequentially activating one of first group of clock selection signals indicating a clock signal to be selected from the N-phase clock signals; an edge appearance time adjustment circuit 103 for adjusting a rising edge appearance time and/or a trailing edge appearance time of the first group of clock selection signals outputted from the control circuit 104 to output second group of clock selection signals; and a modulated clock signal generating circuit 102 for selecting one clock signal from the N-phase clock signals in accordance with an activated state of the second group of clock selection signals outputted from the edge appearance time adjustment circuit 103 to output a modulated clock signal MCK.

6 Claims, 22 Drawing Sheets

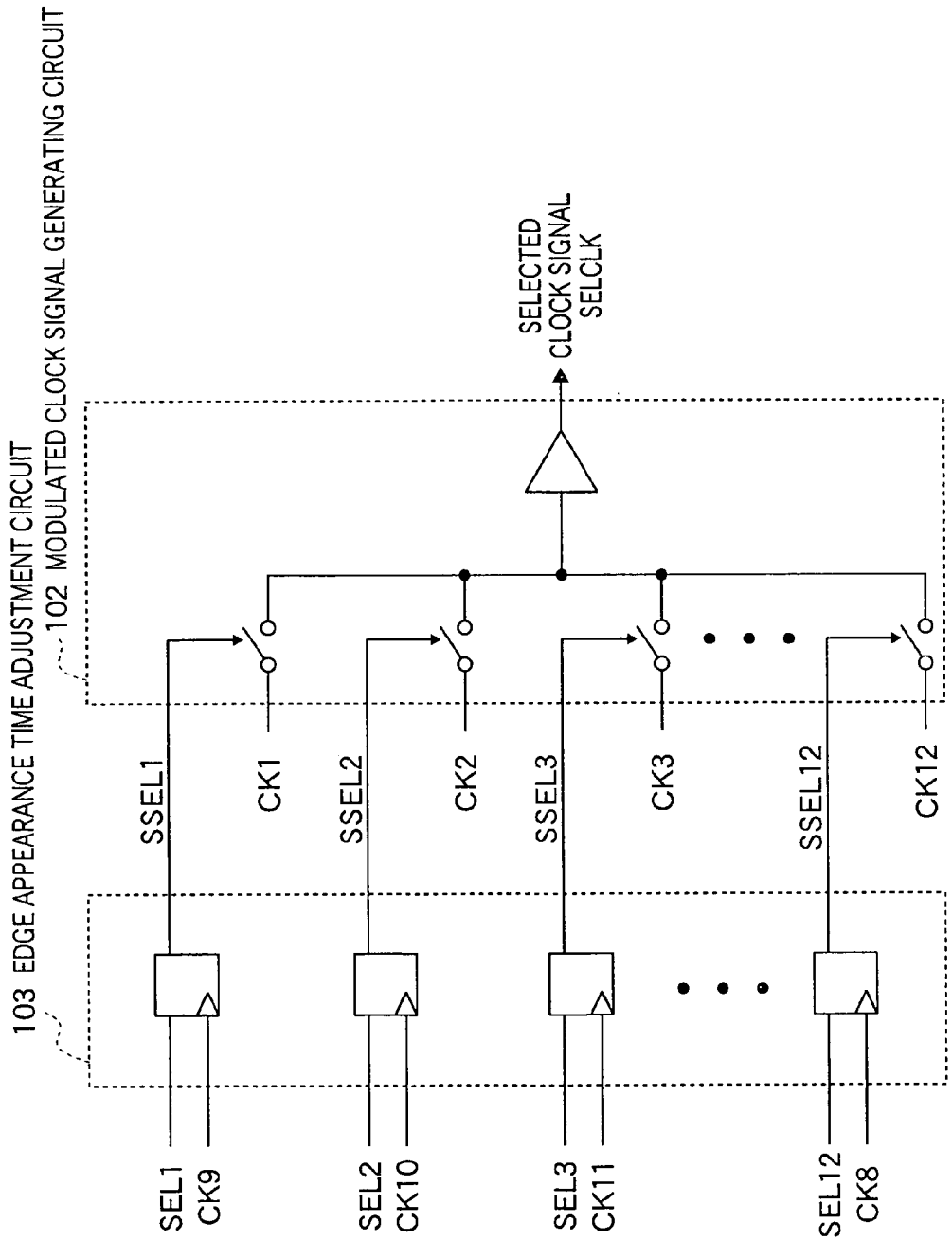

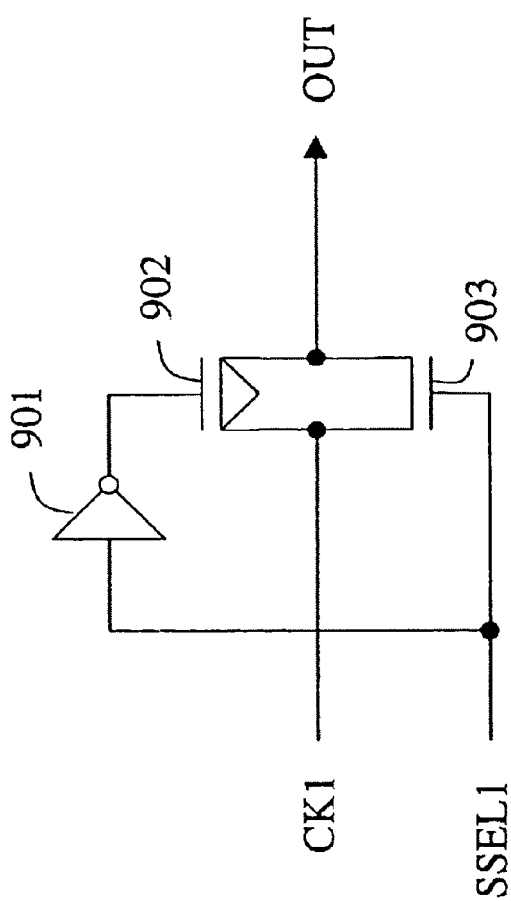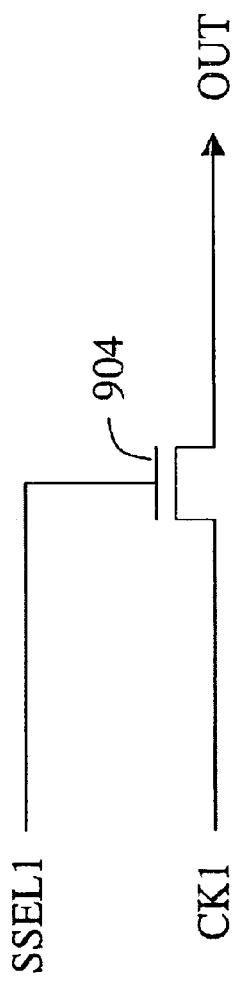
FIG.7A
FIG.7B

WHEN NOT MODULATED

WHEN MODULATION PERIOD IS SHORT

WHEN MODULATION PERIOD IS LONG

FREQUENCY MODULATOR APPARATUS OF PHASE SELECTION TYPE, AND FREQUENCY SYNTHESIZER OF PHASE SELECTION TYPE

TECHNICAL FIELD

The present invention relates to a phase-selective type frequency modulator and a phase-selective type frequency synthesizer capable of reducing electromagnetic interference (hereinafter, referred to as "EMI") in electronic equipment which transmits image data, etc.

BACKGROUND ART

With the rapid operation of electronic equipment, the EMI in the electronic equipment becomes a problem and the reduction of the EMI is required. As one technology for reducing the EMI in electronic equipment, a method employing a spread spectrum clock signal has been proposed. More specifically, jitter is intentionally generated so that a peak of a spectrum may not be generated at a particular frequency, or a frequency is varied gradually with a cycle, that provides no influence on the operation of the circuit, for example, a cycle in a range from several of kilo Hertz to several hundreds of kilo Hertz.

FIG. 17 is a functional block diagram showing a configuration of a clock signal generator disclosed in Japanese Patent Application Publication JP-A-2001-148690. As shown in FIG. 17, the above-mentioned clock signal generator has a clock generating unit 2001 for generating m-phase clock signals S1$m$ having a desired frequency and phases shifted by a constant interval between adjacent two clock signals, a selector unit 2003 for selecting one of the m-phase clock signals S1$m$, and a dithering control unit 2002 for determining the selection in the selector unit 2003. The m-phase clock signals S1$m$ generated in the clock generating unit 2001 are supplied to the selector unit 2003 and taken out via an output terminal 2005. To the selector unit 2003, a control signal SEL is supplied from the dithering control unit 2002. The selector unit 2003 sequentially selects one of the m-phase clock signals S1$m$ in accordance with the control signal SEL and thus obtained clock signal S2 can be taken out from an output terminal 2004. The dithering control unit 2002 for controlling the selector unit 2003 generates a selection signal SEL such that the spectrum of the clock signal S2 obtained at the output terminal 2004 may spread over as wide as possible.

FIG. 18 is a circuit block diagram showing a specific configuration example of the dithering control unit 2002. As shown in FIG. 18, the dithering control unit 2002 includes eight D-type flip-flops 2031 to 2038 forming a serial ring, and three OR circuits 2041 to 2043. When one signal of output signals S0 to S4 is at a high level, other four signals are made to be at low level, and the high-level moves among these signals per cycle of a clock signal CK.

FIG. 19 is a block diagram showing a specific configuration example of the selector unit 2003. The selector unit 2003 includes five switch circuits 2051 to 2055 and a buffer circuit 2056. In synchronization with the above-mentioned output signals S0 to S4, one of five-phase clock signals DC0 to DC4 at ΔT intervals is selected, and a modulated clock signal is generated and outputted via the buffer circuit 2056.

FIG. 20 shows an operation waveform example of the above-mentioned clock signal generator. As shown in FIG. 20, in a time period A, the clock signals are selected in the order of DC0, DC1, DC2, SC3, DC4 and the period of the modulated clock signal S2 becomes T+ΔT. On the other hand, in a time period B, the clock signals are selected in the order of DC4, DC3, DC2, SC, DC0 and the period of the modulated clock signal S2 becomes T−ΔT. Here, "T" is defined as an inverse number of a frequency $f_{CK}$ of a system clock signal, and, hereinafter, "T" is used in the same sense. Since the operations in the time periods A and B are repeated, +ΔT and −ΔT are cancelled so that the modulation period $T_{mod}$ (not shown) becomes $T_{mod}$=8×T. According to the above-mentioned clock signal generator, a clock signal can be outputted in which peaks on the spectrum are spread, and the EMI can be reduced by operating the electrical equipment employing the clock signal.

However, in the case where the above-mentioned clock signal generator is used, there is a problem as described below. The problem will be explained by referring to FIG. 21. FIG. 21 shows the problem in the operation of the above-mentioned clock signal generator. As shown in FIG. 21, when the edges of the m-phase clock signals S1$m$ (a rising edge 2101 and a trailing edge 2103 are shown in FIG. 21) and the edges of the selection signal SEL overlap one another, the operations of the switch circuits 2051 to 2055 (switching between "0" and "1") provided in the selector unit 2003 as shown in FIG. 19 becomes defective and the waveform of the modulated clock signal becomes deteriorated. That is, within 360 degrees as a clock phase corresponding to one period of the system clock signal as shown in FIG. 21 (the range shown by an arrow), a range of a clock phase of the system clock signal that can be actually changed is restricted to a range obtained by subtracting a range in consideration of a predetermined interval from 180 degrees, i.e., less than 180 degrees.

Here, referring to FIGS. 22A to 22C, the relationship between the modulation period and the spectrum intensity of the clock signal will be explained. FIG. 22A shows the relationship between the spectrum intensity and the frequency when the clock signal is not modulated. FIG. 22B shows the relationship between the spectrum intensity and the frequency when the modulation period is short, that is, 1/Tmod is large. FIG. 22C shows the relationship between the spectrum intensity and the frequency when the modulation period is long, that is, 1/Tmod is small. Here, "Tmod" represents a modulation period and "T" is an inverse number of the frequency $f_{CK}$ of the system clock signal.

As shown in FIG. 22A, when the clock signal is not modulated, a spectrum peak 2201 is observed in the position where f=1/T. In the case where the clock signal is modulated so that the modulation clock frequency may become T−ΔT and T+ΔT for spreading the spectrum as shown in FIG. 22A, peaks are expected to appear at frequencies f=1/(T+ΔT) and f=1/(T−ΔT). However, almost all spectrum components at frequencies f=1/(T+ΔT) and f=1/(T−ΔT) are concentrated at the peak 2201 at a frequency f=1/T when the modulation period is short, i.e., 1/Tmod>Δf, and the power dispersion never occurs as shown in FIG. 22B. Because, according to the nature of the Fourier transform, as to the waveform changing with a cycle of 1/Tmod, peaks appear at frequency intervals of 1/Tmod. On the other hand, when the modulation period is long as shown in FIG. 22C, i.e., 1/Tmod<Δf, the spectrum components at frequencies f=1/(T+ΔT) and f=1/(T−ΔT) appear as peaks. That is, in addition to the peak 2201 at the frequency f=1/T, a peak 2217 and a peak 2215 appear between the frequencies f=1/(T+ΔT) and f=1/(T−ΔT) at frequency intervals of 1/Tmod. With the power dispersion, the intensity of the peak 2201 at the frequency f=1/T becomes lower compared to the intensity of the peak 2201 as shown in FIGS. 22A and 22B, and the occurrence of power dispersion is seen.

Considering a condition under which the modulation effect is seen, it is necessary that the frequency interval at which the peaks appear is shorter than the frequency interval between 1/T and 1/(T+ΔT). That is, the following expression (1) is required to hold.

$$1/T\text{mod} < ABS(1/T - 1/(T \pm \Delta T)) \approx \Delta T/T^2 \quad (1)$$

Where ABS(X) represents an absolute value of X.

Here, given that the number of phases of multiphase clock signals is N, the modulation period Tmod is expressed by the following expression (2).

$$T\text{mod} = 2N \times T \quad (2)$$

With the expressions (1) and (2), the following expression (3) can be introduced.

$$T/2 < N \times \Delta T \quad (3)$$

Here, N×ΔT corresponds to the range in which the phase is valuable in the circuits as shown in FIGS. 17–19, and a phase valuable range of at least 180 degrees is required as described above.

DISCLOSURE OF THE INVENTION

Accordingly, in view of the above-mentioned points, an object of the present invention is to provide a phase-selective type frequency modulator and a phase-selective type frequency synthesizer capable of easing the restriction on a phase range of a modulated clock signal.

In order to solve the above-mentioned problems, a phase-selective type frequency modulator according to one aspect of the present invention includes: multiphase clock signal generating means for generating N-phase clock signals having phase differences from each others; control means for sequentially activating one of first group of clock selection signals indicating a clock signal to be selected from the N-phase clock signals outputted from the multiphase clock signal generating means, the first group of clock selection signals corresponding to the N-phase clock signals; edge appearance time adjusting means for adjusting a rising edge appearance time and/or a trailing edge appearance time of the first group of clock selection signals outputted from the control means to output second group of clock selection signals corresponding to the N-phase clock signals outputted from the multiphase clock signal generating means; and modulated clock signal generating means for selecting one clock signal from the N-phase clock signals in accordance with an activated state of the second group of clock selection signals outputted from the edge appearance time adjusting means to output the selected clock signal as a modulated clock signal.

Further, a phase-selective type frequency synthesizer according to one aspect of the present invention includes: control means for sequentially activating one of first group of clock selection signals indicating a clock signal to be selected from N-phase clock signals having phase differences from each others, the first group of clock selection signals corresponding to the N-phase clock signals; edge appearance time adjusting means for adjusting a rising edge appearance time and/or a trailing edge appearance time of the first group of clock selection signals outputted from the control means to output second group of clock selection signals corresponding to the N-phase clock signals; modulated clock signal generating means for selecting one clock signal from the N-phase clock signals in accordance with an activated state of the second group of clock selection signals outputted from the edge appearance time adjusting means to output the selected clock signal; phase comparing means for comparing a phase of a reference clock signal and a phase of the clock signal selected by the modulated clock signal generating means; and multiphase clock signal generating means for generating the N-phase clock signals based on a comparison result in the phase comparing means and outputting one of the N-phase clock signals as a modulated clock signal.

According to the present invention, since the restriction on the phase range of the modulated clock signal can be eased, the EMI can be further reduced.

BRIEF DESCRIPTION OF THE DRAWINGS

Advantages and features of the present invention will be clear by considering the following detailed description and the drawings in relation. In these drawings, the same reference numerals indicate the same component elements.

FIG. 6 shows a configuration example including a modulated clock signal generating circuit and an edge appearance time adjustment circuit as shown in FIG. 2;

FIGS. 7A and 7B show configuration examples of a switch circuit in FIG. 5;

BEST MODE FOR CARRYING OUT THE INVENTION

Figure 1:
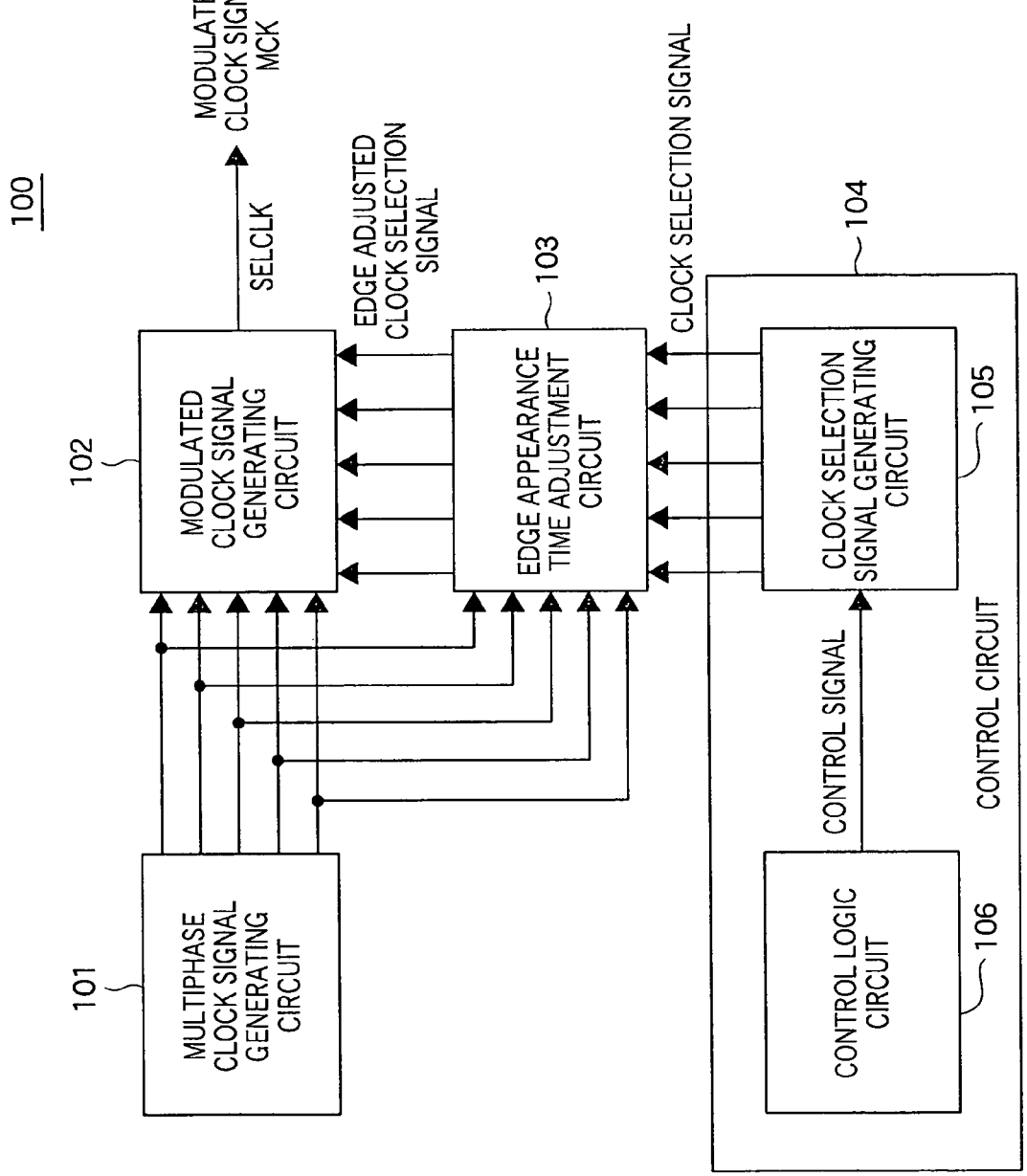
FIG. 1 is a block diagram showing a configuration of a phase-selective type frequency modulator according to a first embodiment of the present invention.

In a phase-selective type frequency modulator and a phase-selective type frequency synthesizer according to the present invention, in order to generate a modulated clock signal in which the restriction of phase valuable range is eased to reduce the EMI, a circuit is formed such that a rising edge appearance time and/or a trailing edge appearance time of one clock signal selected from N-phase clock signals and a rising edge appearance time and/or a trailing edge appearance time of a clock selection signal for selecting the clock signal may have time lag and may not overlap one another.

Here, in the case where a number "N" of phases of the N-phase clock signals is an integer number equal to or more than four, the phase-selective type frequency modulator and the phase-selective type frequency synthesizer according to the present invention exert effects.

More specifically, when a modulated clock signal is generated by selecting one clock signal (referred to as a "first clock signal") from the N-phase clock signals from 1 to N having different phases, as a clock selection signal for selecting the first clock signal, a second clock selection signal is generated which has the edge appearance time adjusted based on another clock signal (referred to as a "second clock signal") having a different phase from the first clock signal among the N-phase clock signals and which the first clock signal indicates to be selected. According to the activated state of the second clock selection signal (e.g., high-level or low-level), one of the N-phase clock signals CK1 to CKN is selected and the selected clock signal is outputted as a modulated clock signal.

Thereby, the rising edge appearance time and/or the trailing edge appearance time of the first clock signal and the rising edge appearance time and/or the trailing edge appearance time of the second group of clock selection signals for selecting the first clock signal can be arbitrarily shifted.

Based on the above consideration, a phase-selective type frequency modulator according to embodiments of the present invention will be explained by referring to the drawings as below.

FIG. 1 shows a configuration of a phase-selective type frequency modulator according to a first embodiment of the present invention. As shown in FIG. 1, a phase-selective type frequency modulator 100 according to the first embodiment of the present invention includes a multiphase clock signal generating circuit 101 for generating multiphase clock signals, a modulated clock signal generating circuit 102 for performing modulation operation by selecting one clock signal from the multiphase clock signals, an edge appearance time adjustment circuit 103, and a control circuit 104 having a clock selection signal generating circuit 105 and a control logic circuit 106 for controlling it. A number "N of phases of the multiphase clock signals is, for example, 6, 12, or the like. The modulated clock signal generating circuit 102 outputs a selected clock signal SELCLK as a modulated clock signal MCK.

Figure 2:
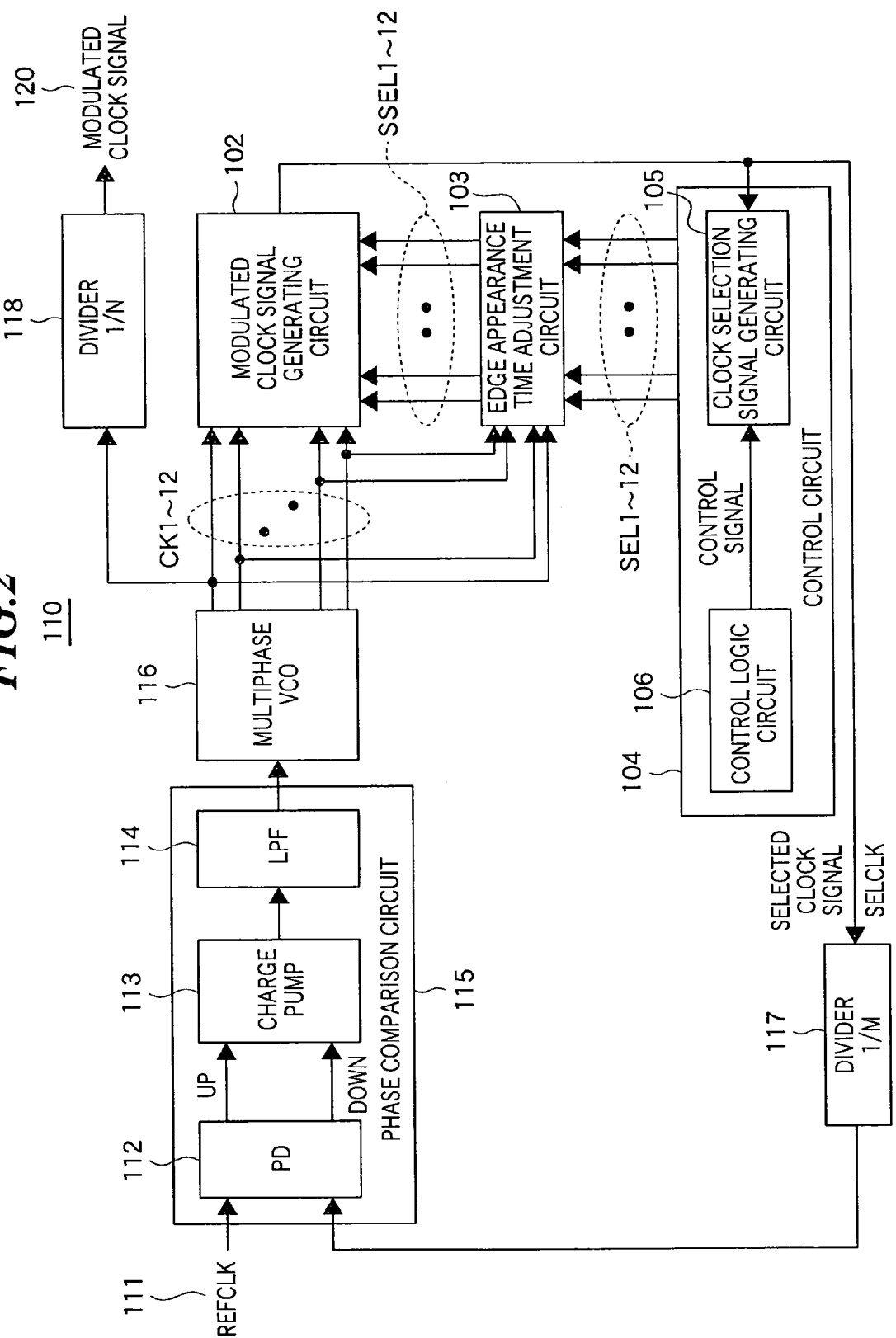
FIG. 2 is a block diagram showing a configuration of a phase-selective type frequency synthesizer according to the first embodiment of the present invention.

FIG. 2 shows a configuration of a phase-selective type frequency synthesizer employing the phase-selective type frequency modulator in FIG. 1. A phase-selective type frequency synthesizer 110 modulates an inputted reference clock signal (REFCLK) 111 to output it as a modulated clock signal 120. The phase-selective type frequency synthesizer includes a phase comparison circuit 115 having a phase detector (PD) 112, a charge pump 113, and a loop filter 114 such as a low pass filter (LPF), and a multiphase (N-phase) voltage controlled oscillator (VCO) 116. Furthermore, the phase-selective type frequency synthesizer includes a modulated clock signal generating circuit 102, an edge appearance time adjustment circuit 103, and a control circuit 104 having a clock selection signal generating circuit 105 and a control logic circuit 106 similar to those shown in FIG. 1. The output of the modulated clock signal generating circuit 102 is controlled by the phase comparison circuit 115 which compares a phase of a clock signal fed back via a divider 117 and a phase of the reference clock signal (REFCLK) 111. A clock signal CK1 as one of the output of the multiphase VCO 116 is divided in a divider 118, and the modulated clock signal 120 is outputted which has a frequency modulated into a desired value.

The modulated clock signal generating circuit 102 selects one of N-phase clock signals outputted from the multiphase VCO 116 to output it as a selected clock signal SELCLK. By comparing a phase of the feed back signal and a phase of the reference clock signal (REFCLK) 111 in the phase comparison circuit 115 and controlling the output of the modulated clock signal generating circuit 102, the modulated clock signal 120, which has a frequency modulated into a desired value, is generated based on the clock signal CK1 as one of outputs of the multiphase VCO 116.

In the above-mentioned configuration, when the selection in the selector of the modulated clock signal generating circuit 102 is not changed, the frequency of the modulated clock signal is expressed by the following expression.

$$f0 = f_{REFCLK} \cdot M/N$$

When the selection in the selector is shifted, for example, backwardly one at a time, the frequency of the modulated clock signal is controlled to be $f_{max} = f0 \cdot 13/12$. Oppositely, when the selection in the selector is forwardly shifted, for example, forwardly one at a time, the frequency of the modulated clock signal is controlled to be $f_{min} = f0 \cdot 11/12$. By mixing the manners of shifting selection in the selector, the frequency of the modulated clock signal can be controlled to be an arbitrary value between $f_{min}$ and $f_{max}$.

By controlling the manners of shifting selection in the selector by using delta sigma modulation according to frequency data, it is possible to cause the frequency of the modulated clock signal to be a value set by the frequency data. The order of the delta sigma modulation may be first order, second order or higher order. However, the accuracy in the case of second order is higher than that in the case of first order, and in the case of third or higher order, the circuit is scaled up although the effect is not so different from that in the case of second order. Therefore, about second order is desirable.

Figure 3:
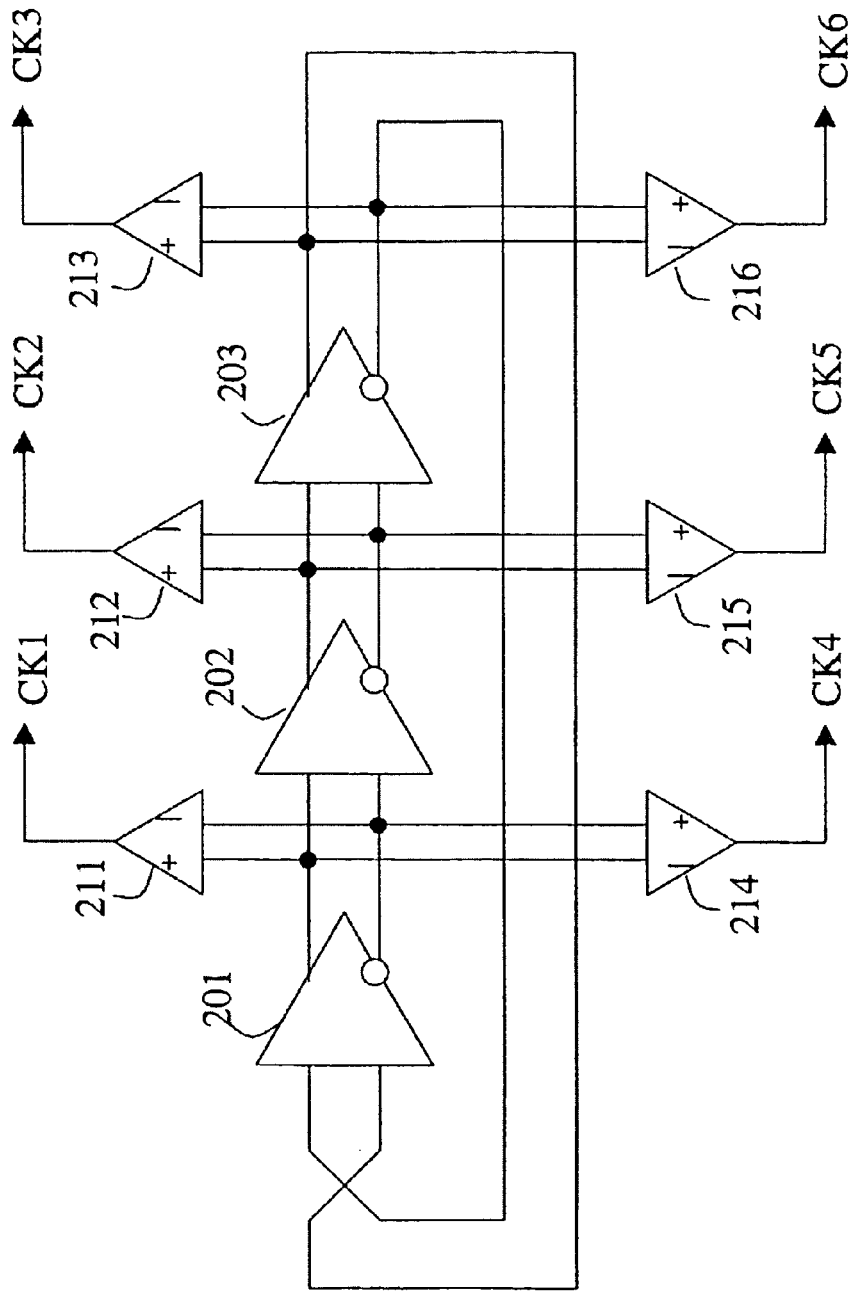
FIG. 3 is a block diagram showing a configuration example of a multiphase clock signal generating circuit as shown in FIG. 1.

FIG. 3 shows a configuration example of the multiphase clock signal generating circuit 101 as shown in FIG. 1. The multiphase clock signal generating circuit 101 as shown in FIG. 3 has three differential amplifiers 201 to 203 and six comparators 211 to 216. The three differential amplifiers 201 to 203 form a ring oscillator. The six comparators 211 to 216 compare non-inversion outputs and inversion outputs of the differential amplifiers 201 to 203, which have delays, in the comparators 211 to 216 to convert them into six-phase clock signals CK1 to CK6. By setting all delay times of the differential amplifiers 201 to 203 to be equal, the six-phase clock signals CK1 to CK6 can be made at equal phase intervals.

Figure 4:
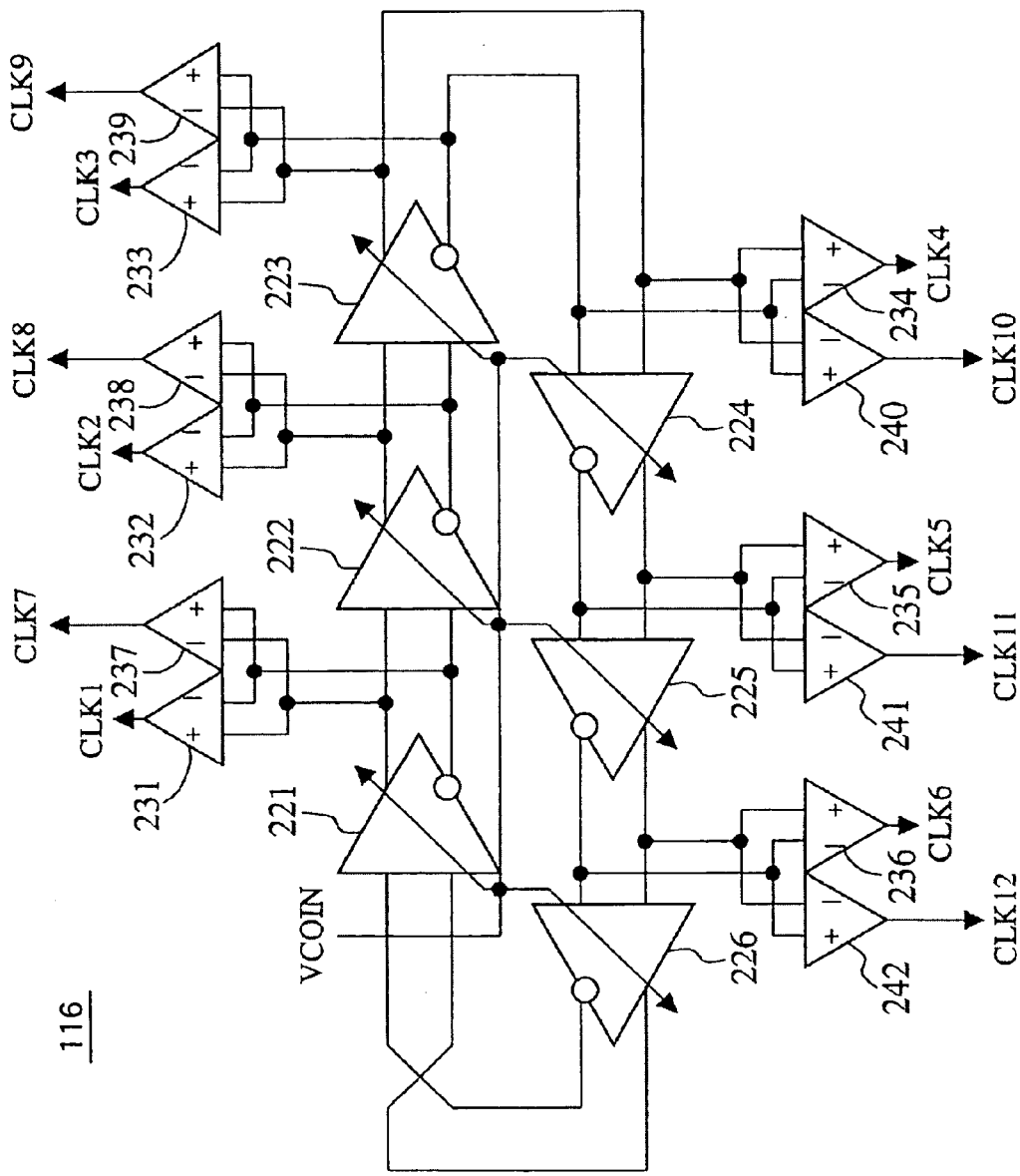
FIG. 4 is a block diagram showing a configuration example of a multiphase VCO as shown in FIG. 2.

FIG. 4 shows a configuration example of the multiphase VCO 116 as shown in FIG. 2. The multiphase VCO 116 as shown in FIG. 4 has a ring oscillator formed by six differential amplifiers 221 to 226 and twelve comparators 231 to 242. By the control voltages of the differential amplifiers 221 to 226, delay times at the respective differential amplifiers can be changed and the frequency can be controlled. Further, by performing level conversion on the outputs of each differential amplifier by using two comparators for normal and inversion, twelve-phase clock signals CLK1 to CLK12 are generated.

Figure 5:
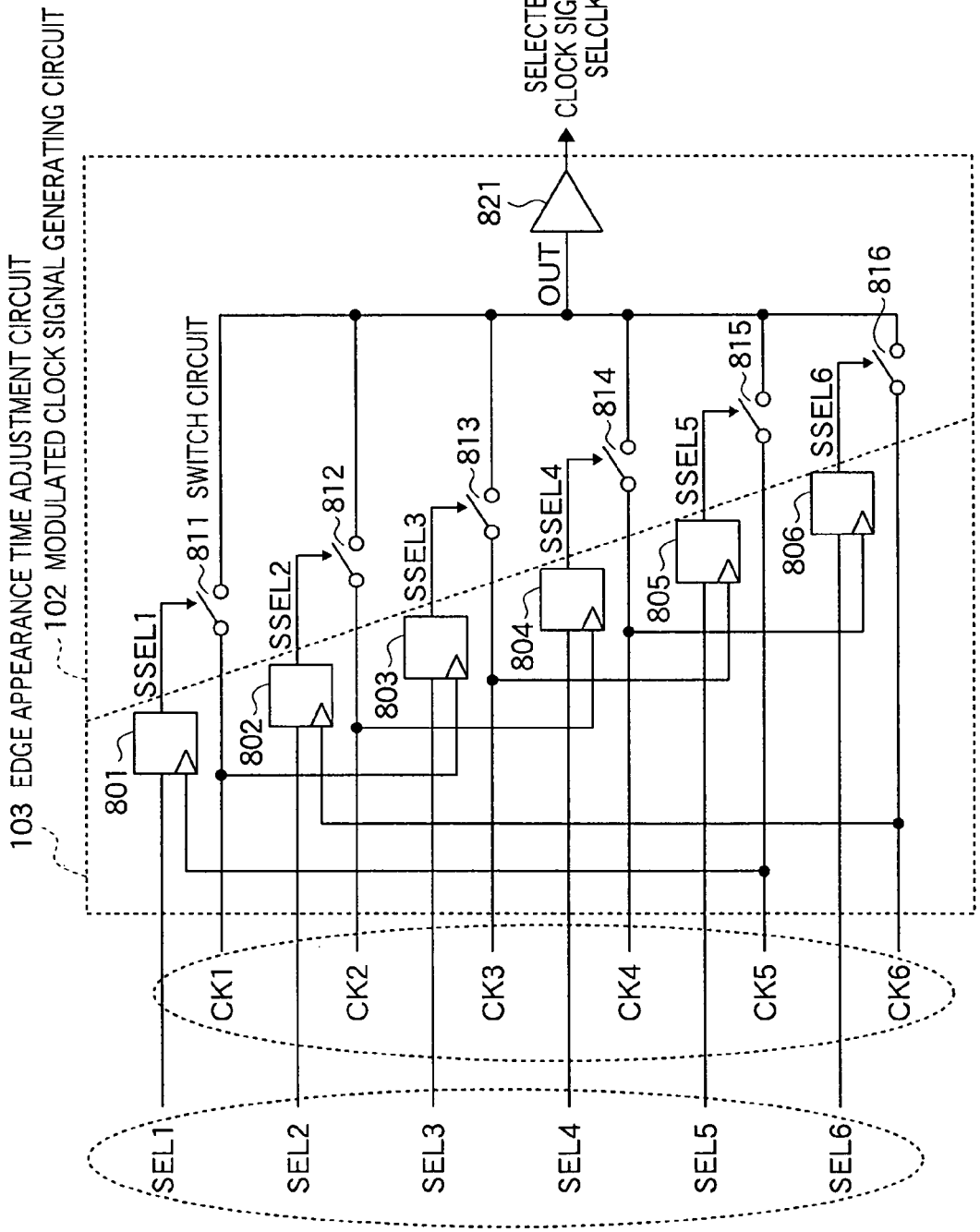
FIG. 5 shows a configuration example including a modulated clock signal generating circuit and an edge appearance time adjustment circuit as shown in FIG. 1.

FIG. 5 shows a configuration example including the modulated clock signal generating circuit 102 and the edge appearance time adjustment circuit 103 as shown in FIG. 1. As shown in FIG. 5, the edge appearance time adjustment circuit 103 includes flip-flop circuits 801 to 806 and the modulated clock signal generating circuit 102 includes switch circuits 811 to 816 corresponding to the flip-flop circuits 801 to 806 and a buffer circuit 821 commonly provided for outputs thereof.

To the respective input terminals of the flip-flop circuits 801 to 806, corresponding first group of clock selection signals SEL1 to SEL6 are inputted, and, to the clock signal terminals thereof, there are inputted respective clock signals CK1 to CK6 having a phase difference within a predetermined range from the clock signals selected in accordance with the first group of clock selection signals SEL1 to SEL6. For example, the clock selection signal SEL1 is inputted to the input terminal of the flip-flop circuit 801 and the clock signal CK5 is inputted to the clock signal terminal thereof. Similarly, the clock selection signal SEL2 is inputted to the input terminal of the flip-flop circuit 802 and the clock signal CK6 is inputted to the clock signal terminal thereof.

Thereby, the first group of clock selection signals SEL1 to SEL6 inputted to the flip-flop circuits 801 to 806, respectively, are latched in synchronization with respective clock signals having a phase leading by T/3 (120 degrees) the clock signals CK1 to CK6 respectively selected by the first group of clock selection signals SEL1 to SEL6, and the latched signals are outputted as second group of clock selection signals (switch control signals) SSEL1 to SSEL6 for controlling ON/OFF of the corresponding first to sixth switch circuits 811 to 816.

To prevent edge appearance times from overlapping between the second group of clock selection signals SSEL1 to SSEL6 and respective clock signals selected thereby, the widest margin is obtained in the case where the phase difference between the selected clock signal and the clock signal to be used for latching the first group of clock selection signals in the flip-flop circuits is set on about 90 degrees. FIG. 5 shows the case where the phase difference is 120 degrees as an example.

To the input sides of the switch circuits 811 to 816, corresponding clock signals CK1 to CK6 are inputted, ON/OFF control is performed according to the second group of clock selection signals SSEL1 to SSEL6, and the selected one clock signal is transmitted to the output side. The output sides of the switch circuits 811 to 816 are commonly connected and the selected clock signal is outputted as a selected clock signal SELCLK via a buffer circuit 821.

FIG. 6 shows a configuration example including a twelve-phase modulated clock signal generating circuit 102 and the edge appearance time adjustment circuit 103. Since the edge appearance time adjustment circuit 103 adjusts the activation timing of second group of clock selection signals SSEL1 to SSEL12, the edge appearance times are constantly at fixed intervals between the second group of clock selection signals and the selected respective clock signals, and the edges of both never overlap.

In the edge appearance time adjustment circuit 103, the first group of clock selection signals SEL1 to SEL12 are latched in synchronization with respective clock signals having a predetermined phase difference from the corresponding clock signals CK1 to CK12, and outputted as second group of clock selection signals SSEL1 to SSEL12 in which edges have been adjusted. The modulated clock signal generating circuit 102 selects one of the clock signals CK1 to CK12 according to the second group of clock selection signals SSEL1 to SSEL12 and outputs it as a selected clock signal SELCLK.

FIGS. 7A and 7B show configuration examples of the switch circuit 811 within the modulated clock signal generating circuit 102 in FIG. 5. The switch circuit as shown in FIG. 7A is an analog switch of CMOS circuits and has an N-channel MOS transistor 903, a P-channel MOS transistor 902 and an inverter 901. To the control terminal (gate terminal) of the N-channel MOS transistor 903, one of the second group of clock selection signals (switch control signals), e.g., a clock selection signal SSEL1 as shown in FIG. 5 is inputted. To the gate terminal of the P-channel MOS transistor 902, the clock selection signal SSEL1 inversed by the inverter 901 is inputted. When the clock selection signal SSEL1 is set at a high level, the analog switch becomes conductive and the clock signal CK1 inputted to the analog switch is transmitted to the output terminal OUT of the analog switch.

The switch circuit as shown in FIG. 7B employs an N-channel MOS transistor 904, and a clock selection signal SSEL1 is inputted to the gate terminal of the N-channel MOS transistor 904. When the second clock selection signal SSEL1 is at a high level, the clock signal CK1 inputted to the switch circuit is transmitted to the output terminal OUT of the switch circuit.

By the way, the switch circuits 812 to 816 and the switch circuits in FIG. 6 may be formed similarly to that shown in FIG. 7A or 7B.

Figure 8:
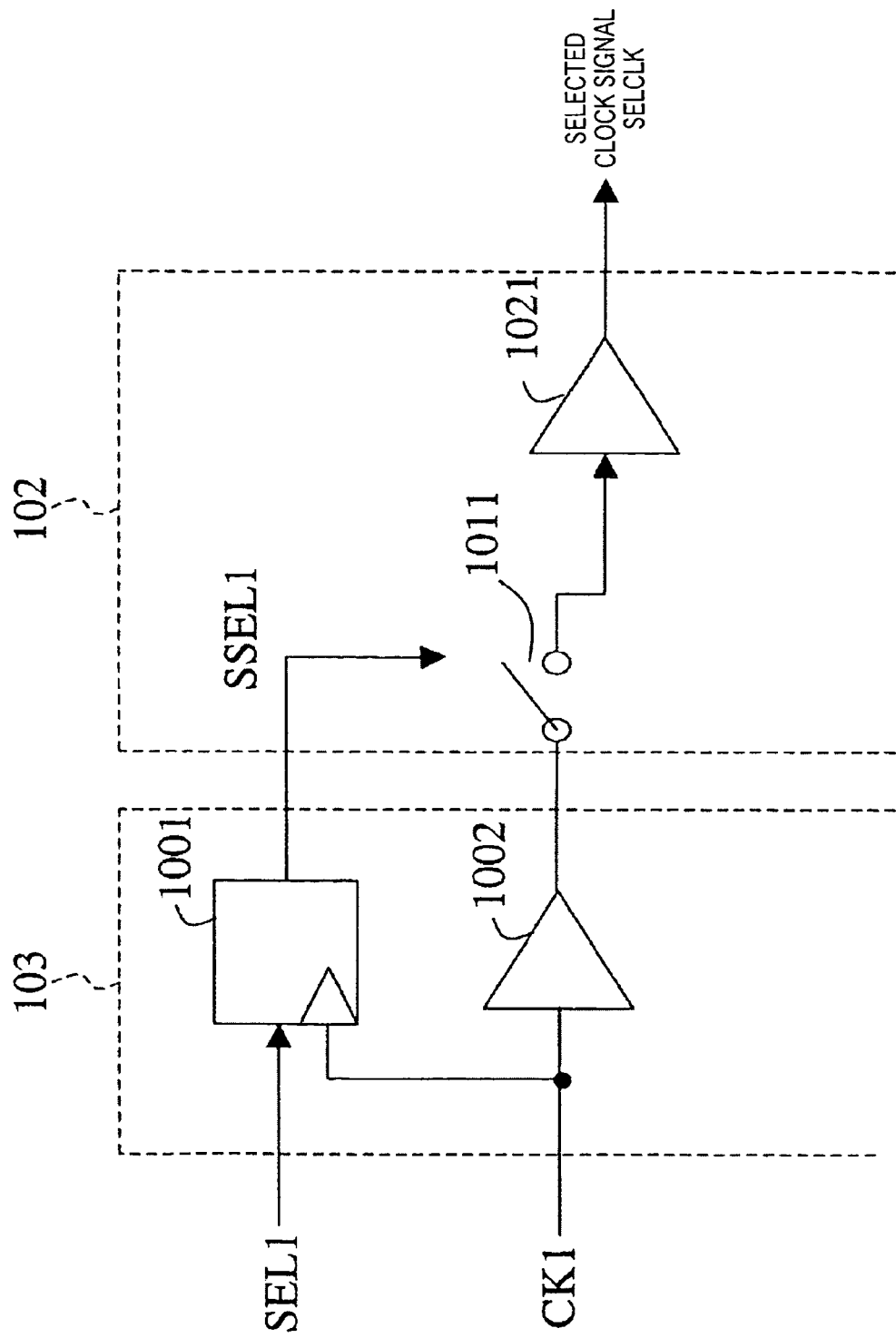
FIG. 8 shows a modified example of the modulated clock signal generating circuit and the edge appearance time adjustment circuit as shown in FIG. 5 or 6.

FIG. 8 shows a modified example of the modulated clock signal generating circuit and the edge appearance time adjustment circuit as shown in FIG. 5 or 6. In FIG. 8, differences from the configuration as shown in FIG. 5 or 6 are in the point where, to the clock signal input terminal of a flip-flop circuit corresponding to the switch circuit 1011, a clock signal CK1 same as a clock signal inputted to the corresponding switch circuit 1011 is inputted, and the point where there is provided a delay circuit 1002 for delaying the clock signal CK1 inputted to the switch circuit 1011. Practically, N circuits as above-mentioned are provided.

In the case of employing the configuration as shown in FIG. 8, a clock signal delayed by the delay circuit 1002 relative to the clock signal CK1 is similarly inputted to the switch circuit 1011, and therefore, a clock signal different in edge appearance time from the clock signal CK1 inputted to the flip-flop circuit 1001 can be inputted to the switch circuit 1011.

Figure 9:
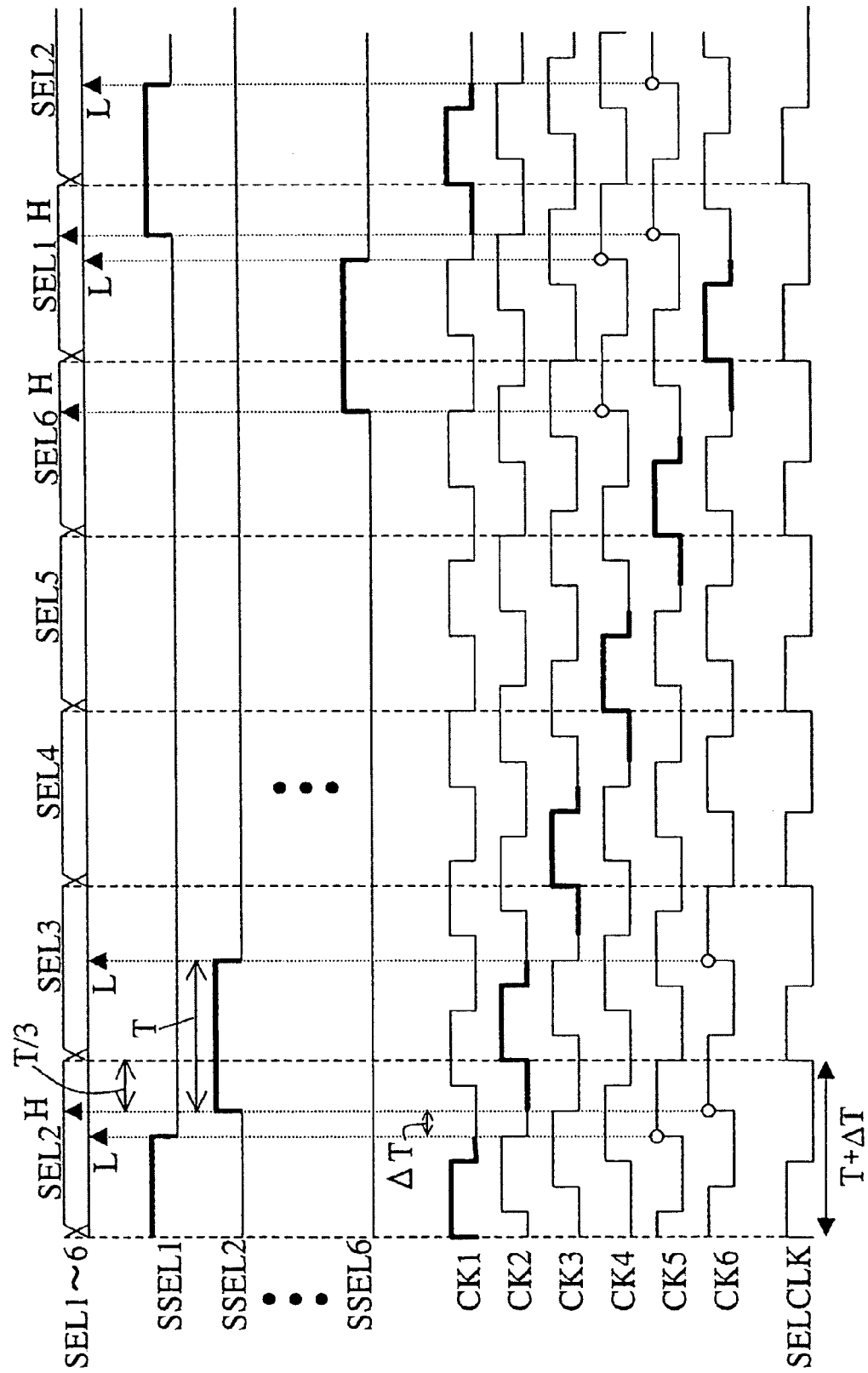
FIG. 9 is a timing chart for explaining an operation of the modulated clock signal generating circuit and the edge appearance time adjustment circuit.
Figure 10:
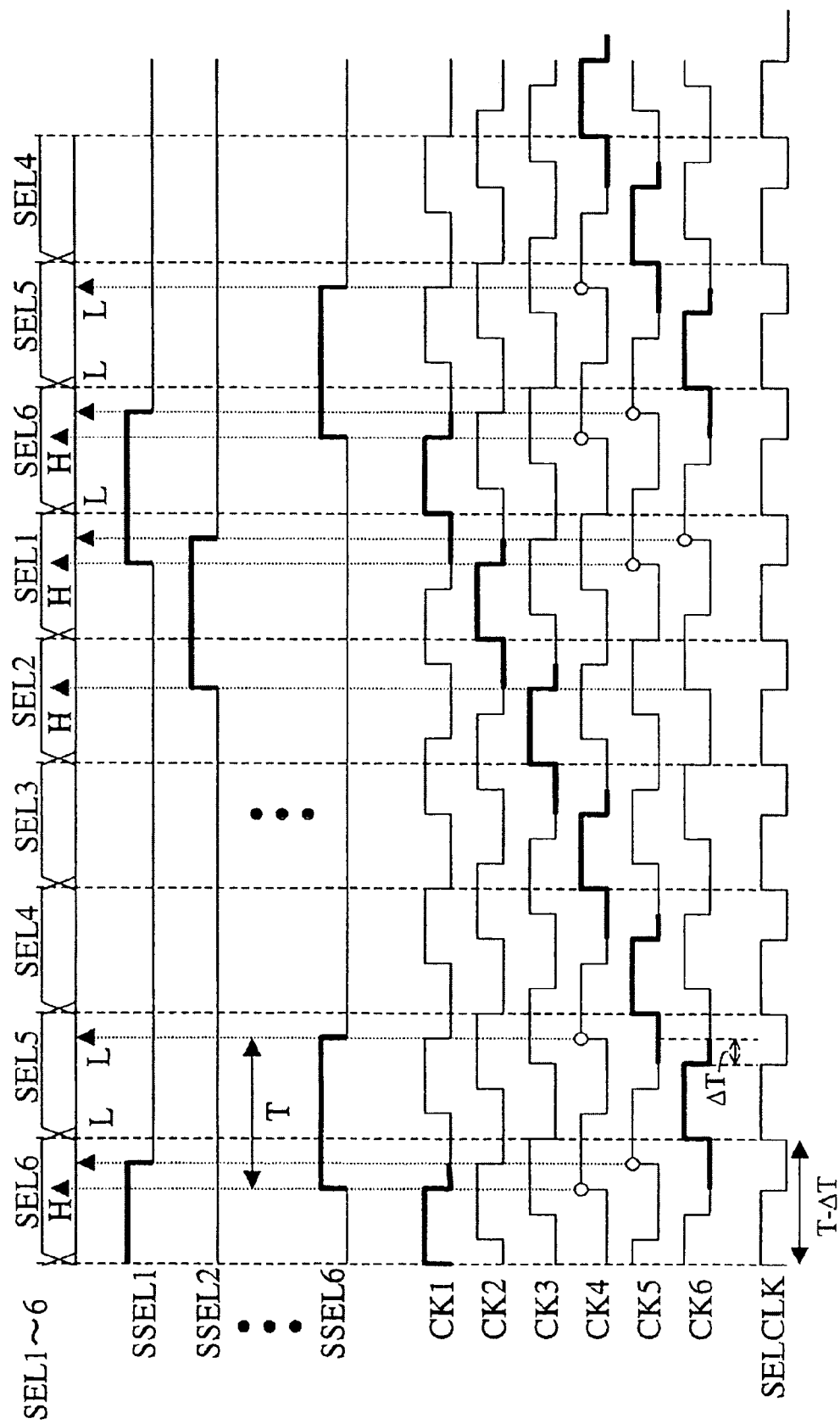
FIG. 10 is a timing chart for explaining an operation of the modulated clock signal generating circuit and the edge appearance time adjustment circuit.

Referring to FIGS. 9 and 10, the operations of the above-mentioned modulated clock signal generating circuit and edge appearance time adjustment circuit will be described. In FIGS. 9 and 10, waveforms of the first group of clock selection signals SEL1 to SEL6, the second group of clock selection signals SSEL1 to SSEL6 as substantial selection signals for selecting one of the clock signals CK1 to CK6 in FIG. 5, for example, the clock signals CK1 to CK6 and the selected clock signal SELCLK are shown.

In FIG. 9, the clock signals CK1 to CK6 are shifted in the phase lagging direction. According to the second group of clock selection signals SSEL1 to SSEL6, one of the clock signals CK1 to CK6 is sequentially selected. The period of thus generated selected clock signal SELCLK becomes T+ΔT.

The first group of clock selection signals SEL1 to SEL6 are signals in synchronization with the selected clock signal SELCLK. Accordingly, the second group of clock selection signals SSEL1 to SSEL6 are generated by latching the first group of clock selection signals SEL1 to SEL6 in synchronization with other predetermined clock signals, respectively. In the example as shown in FIG. 9, with respect to the clock signal CK1, by latching the first clock selection signal SEL1 in synchronization with the rising edge of the clock signal CK5, the second clock selection signal SSEL1 is changed into at low level or high level. Further, with respect to the clock signal CK2, by latching the first selection signal SEL2 in synchronization with the rising edge of the clock signal CK6, the second clock selection signal SSEL2 is changed into at low level or high level. Similarly, others of the second group of clock selection signals SSEL3 to SSEL6 are generated.

Here, as clearly seen in FIG. 9, edge appearance positions of the clock signal CK1 and the second clock selection signal SSEL1 generated in synchronization with the clock signal CK5 having a different phase from the clock signal CK1 (leading in phase by T/3, i.e., 120 degrees) are constantly at fixed intervals and the edge appearance times never overlap. Accordingly, with respect to the selected clock signal SELCLK sequentially generated by one of the clock signals CK1 to CK6, the waveform of the selected clock signal never becomes deteriorated because the edge appearance times of the second group of clock selection signals SSEL1 to SSEL6 and the edge appearance times of the respectively selected clock signals CK1 to CK6 never overlap even if the period T+ΔT continues so long. Thus, there is an advantage that selected clock signals SELCLK corresponding to CK1→CK2→CK3→CK4→CK5→CK6→CK1→ . . . can be continuously generated. In FIG. 9, there is a period in which all of the second group of clock selection signals SSEL1 to SSEL6 are at low level, however, within the period, the outputs of the switch circuits are held by parasitic capacitances of elements and wirings.

In FIG. 10, as well as in FIG. 9, one clock signal is sequentially selected from the clock signals CK1 to CK6. However, the case is different in the point where the period of the generated selected clock signal SELCLK is T−ΔT. That is, the clock signals CK1 to CK6 are shifted in the phase leading direction. For example, as clearly seen in FIG. 10, edge appearance times of the clock signal CK1 and the clock selection signal SSEL1 generated based on the clock signal CK5 having a different phase from the clock signal CK1 (leading in phase by T/3, i.e., 120 degrees) are constantly at fixed intervals and the edge appearance times never overlap.

Accordingly, with respect to the selected clock signal SELCLK sequentially generated based on the clock signals CK1 to CK6, no problem arises however long the period T−ΔT continues. Thus, there is an advantage that selected clock signals SELCLK respectively corresponding to CK1→CK2→CK3→CK4→CK5→CK6→CK1→ . . . can be continuously generated. Although the six-phase case has been described in the above description, they operate similarly in the twelve-phase case.

Figure 11:
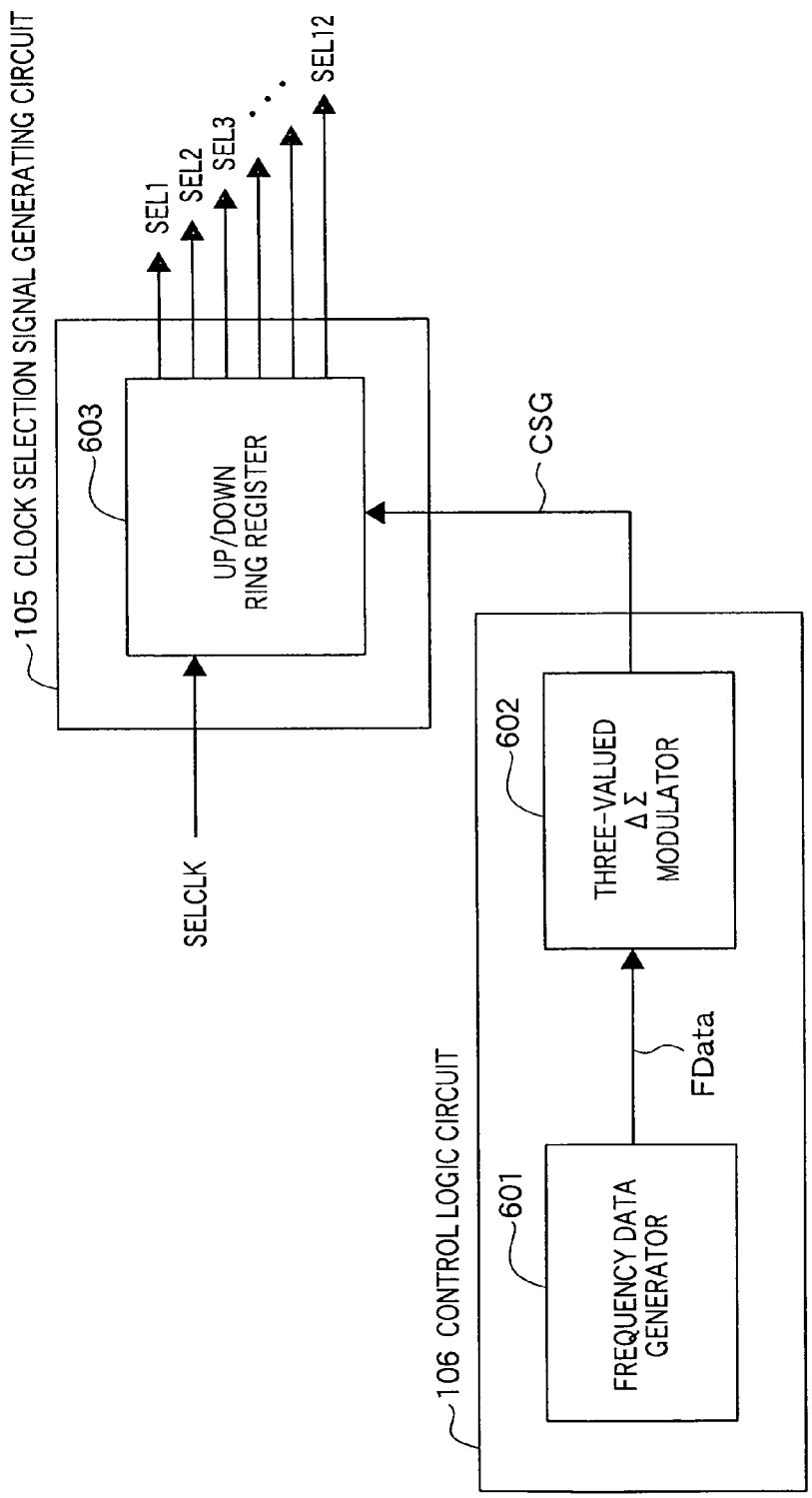
FIG. 11 is a block diagram showing a configuration example of a control circuit as shown in FIG. 1 or 2.

FIG. 11 shows a configuration example of a control circuit 104 for supplying the clock selection signals to the edge appearance time adjustment circuit 103. As shown in FIG. 11, the control circuit 104 includes a control logic circuit 106 having a frequency data generator 601 and a three-valued ΔΣ modulator 602, and a clock selection signal generating circuit 105 having an up/down ring register 603. The ring register 603 causes the state transition in synchronization with the selected clock signal SECLK to generate the first group of clock selection signals SEL1 to SEL12. The frequency data FData outputted from the frequency data generator 601 is inputted to the three-valued ΔΣ modulator 602 and converted into a three-valued control signal CSG. The up/down ring register 603 causes the selection transition forward or backward, or maintains it according to the control signal CSG. Note that, in the phase-selective type frequency modulator as shown in FIG. 1, a period data generator is used in place of the frequency data generator.

Figure 12:
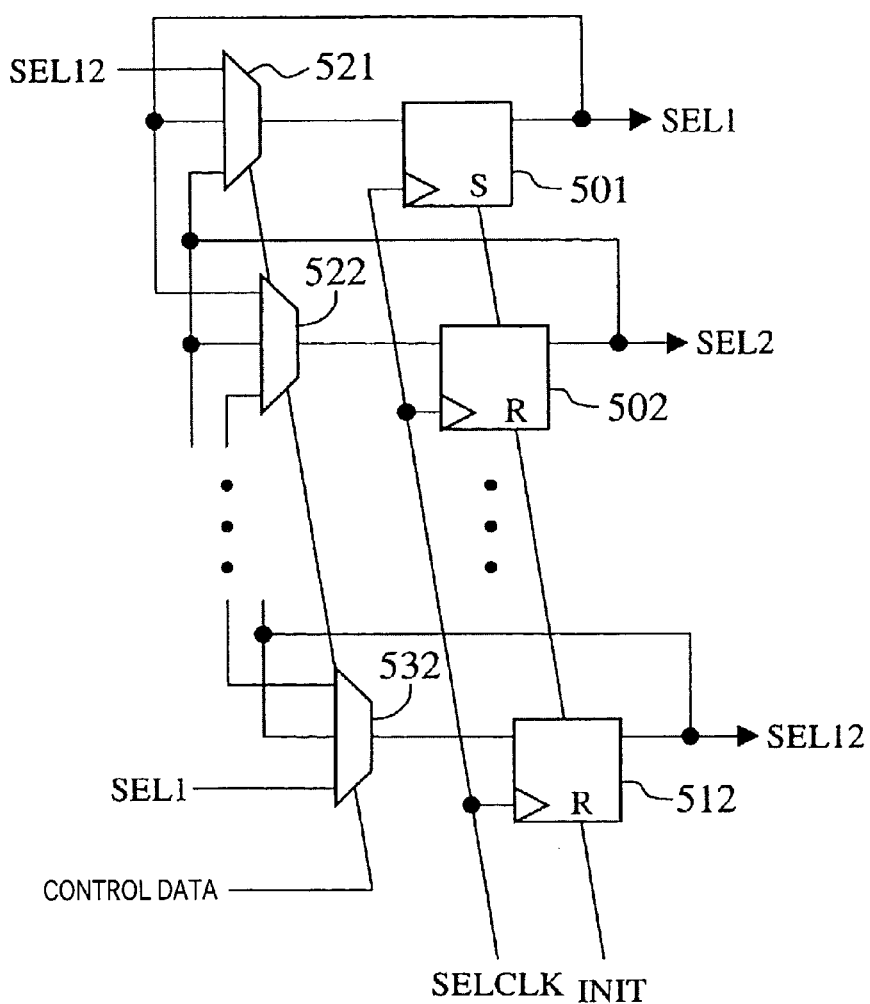
FIG. 12 shows an up/down ring register as shown in FIG. 11.

FIG. 12 shows the up/down ring register 603 as shown in FIG. 11. The up/down ring register 603 has D-type flip-flop circuits (D-FF) 501 to 512 and selector circuits 521 to 532 corresponding to these flip-flop circuits 501 to 512. The output terminals of the flip-flop circuits 501 to 512 are connected to the input terminals of the first group of clock selection signals SEL1 to SEL12 in the edge appearance time adjustment circuit 103 (see FIG. 6), respectively.

The selector circuits 521 to 532 are formed of three-input one-output selector circuits and controlled by the control signal (selector signal) CSG as an output of the control logic circuit 106 (see FIG. 11). More specifically, the selector circuits 521 to 532 are circuits for outputting one of three inputs in accordance with the three conditions of the control signal CSG. On the other hand, the flip-flop circuits 501 to 512 latch the outputs of the selector circuits 521 to 532 in synchronization with the selected clock signal SECLK outputted from the modulated clock signal generating circuit and output them as the first group of clock selection signals SEL1 to SEL12. Thereby, a signal at high level transitions among the first group of clock selection signals SEL1 to SEL12.

Figure 13:
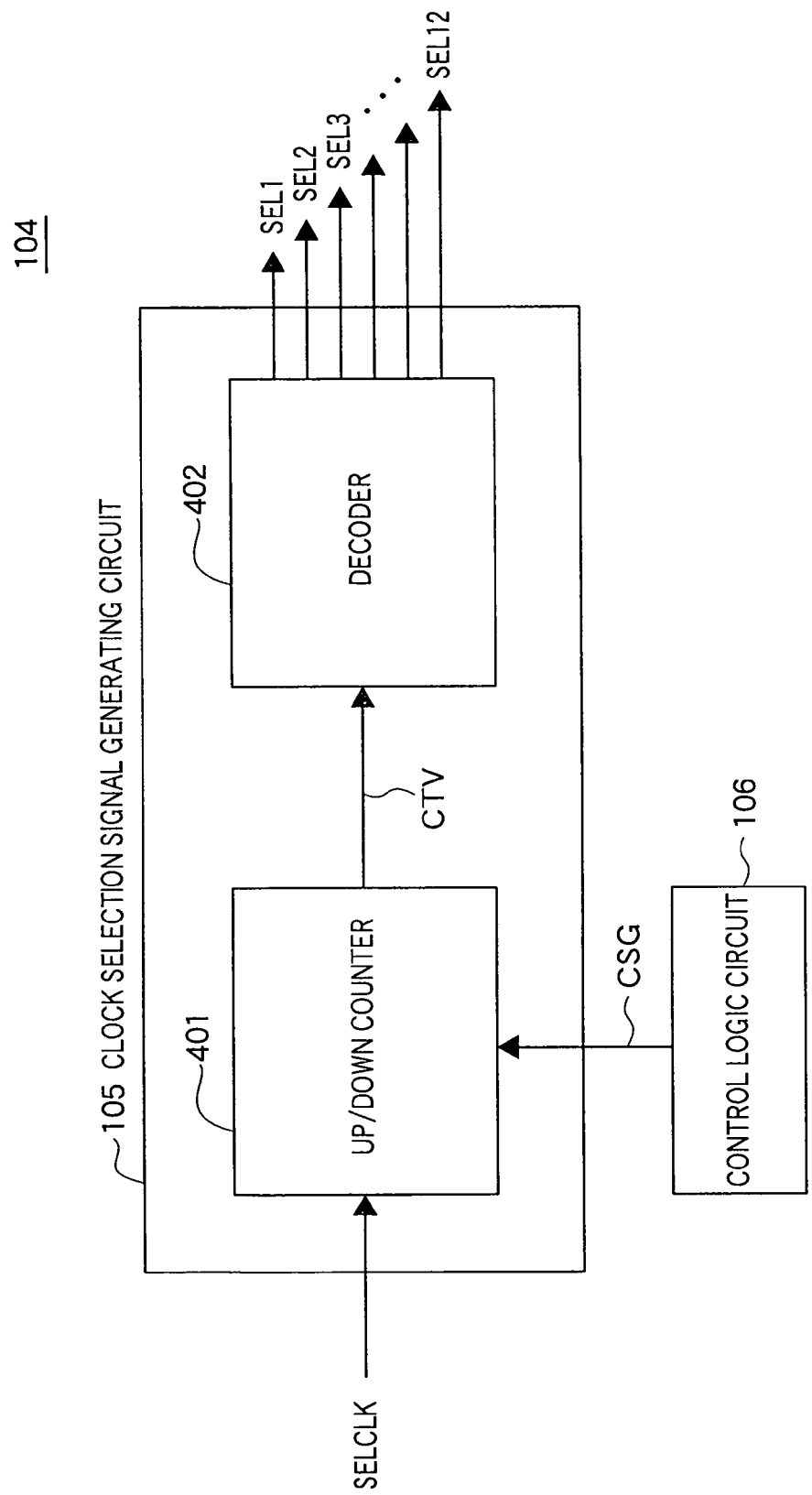
FIG. 13 is a block diagram showing another configuration example of the control circuit as shown in FIG. 1 or 2.

FIG. 13 shows another configuration example of the control circuit 104. The control circuit 104 includes a clock selection signal generating circuit 105 having an up/down counter 401 and a decoder 402, and a control logic circuit 106 for controlling the clock selection signal generating circuit 105. The clock selection signal generating circuit 105 outputs the first group of clock selection signals SEL1 to SEL12 in accordance with the value of the control signal supplied from the control logic circuit 106. Simultaneously, the clock selection signal generating circuit 105 shifts the clock selection signal to be activated to the forward one or backward one, or maintains without change in accordance with the value of the control signal supplied from the control logic circuit 106.

The control logic circuit 106 outputs a control signal CSG for controlling the up/down counter 401. The up/down counter 401 is a counter capable of incrementing or decrementing the value of the counter one at a time when receiving pulse. The up/down counter 401 operates in synchronization with the modulated clock signal (pulse signal) SELCLK, and changes the counter value CTV of the output at each time when receiving the control signal CSG such that 1→2→3→4→ . . . →11→12→1→2→ . . . (UP), or 12→11→ . . . →4→3→2→1→12→11→ . . . (DOWN).

The up/down counter 401 outputs a value corresponding to one of the three operations of "UP", "DOWN" and "HOLD" as a counter value CTV to the decoder 402. The decoder 402 activates one of the first group of clock selection signals SEL1 to SEL12 at a high level among the first group of clock selection signals SEL1 to SEL12 in correspondence with the counter value CTV.

Figure 14:
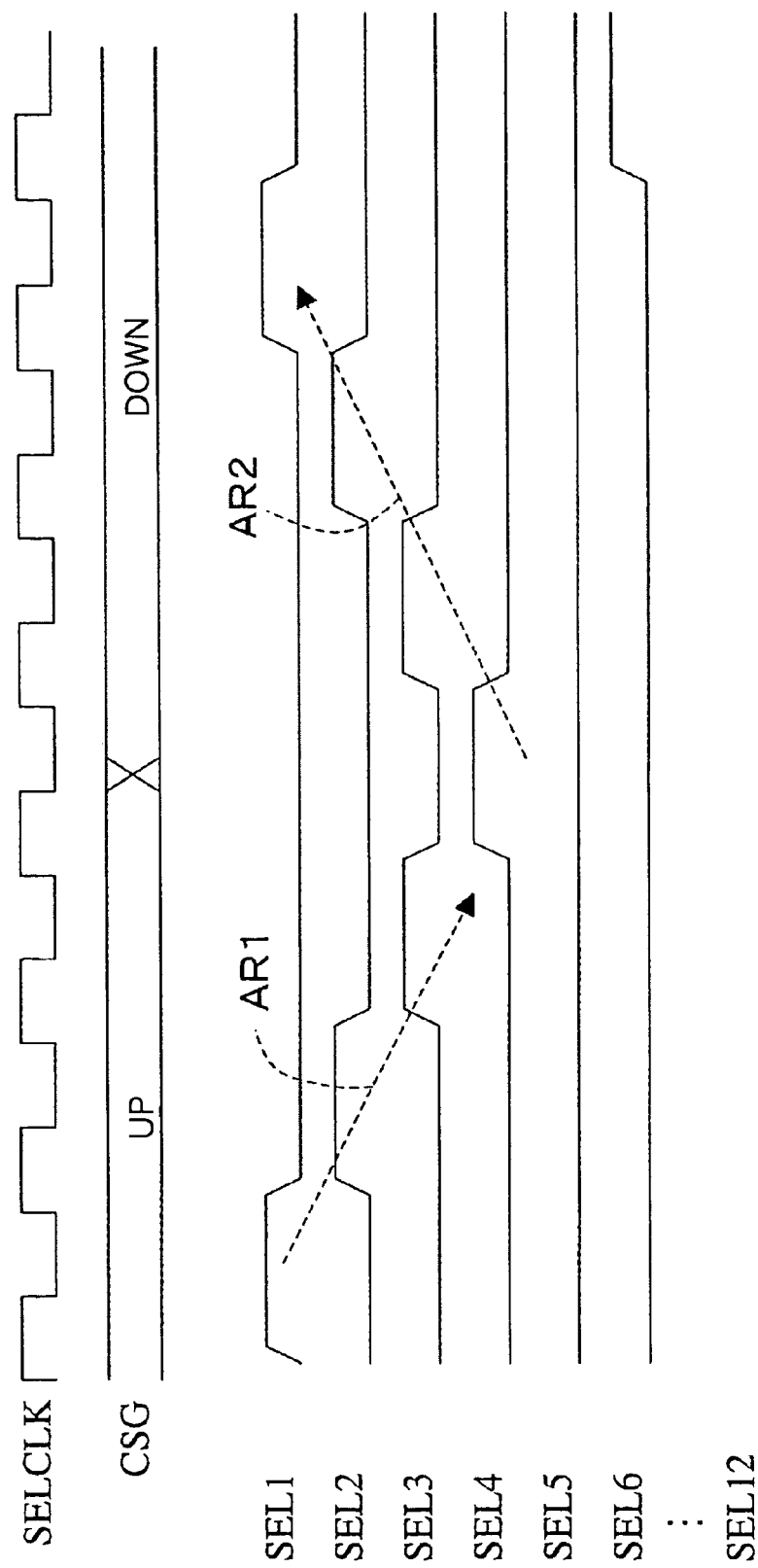
FIG. 14 is a timing chart showing an operation of the control circuit as shown in FIG. 13.

FIG. 14 shows the operation of the control circuit 104 as shown in FIG. 13. The operation of the control circuit 104 differs between the case where the value of the control signal CSG represents "UP" and the case where the value of the control signal CSG represents "DOWN". In the case where the value of the control signal CSG represents "UP", the signal at a high level among the first group of clock selection signals SEL1 to SEL12 changes such that SEL1 →SEL2→ SEL3→ . . . as shown by an arrow AR1. On the other hand, in the case where the value of the control signal CSG represents "DOWN", the signal at high-level among the first group of clock selection signals SEL1 to SEL12 changes such that SEL4→SEL3→SEL2→ . . . as shown by an arrow AR2.

Figure 15:
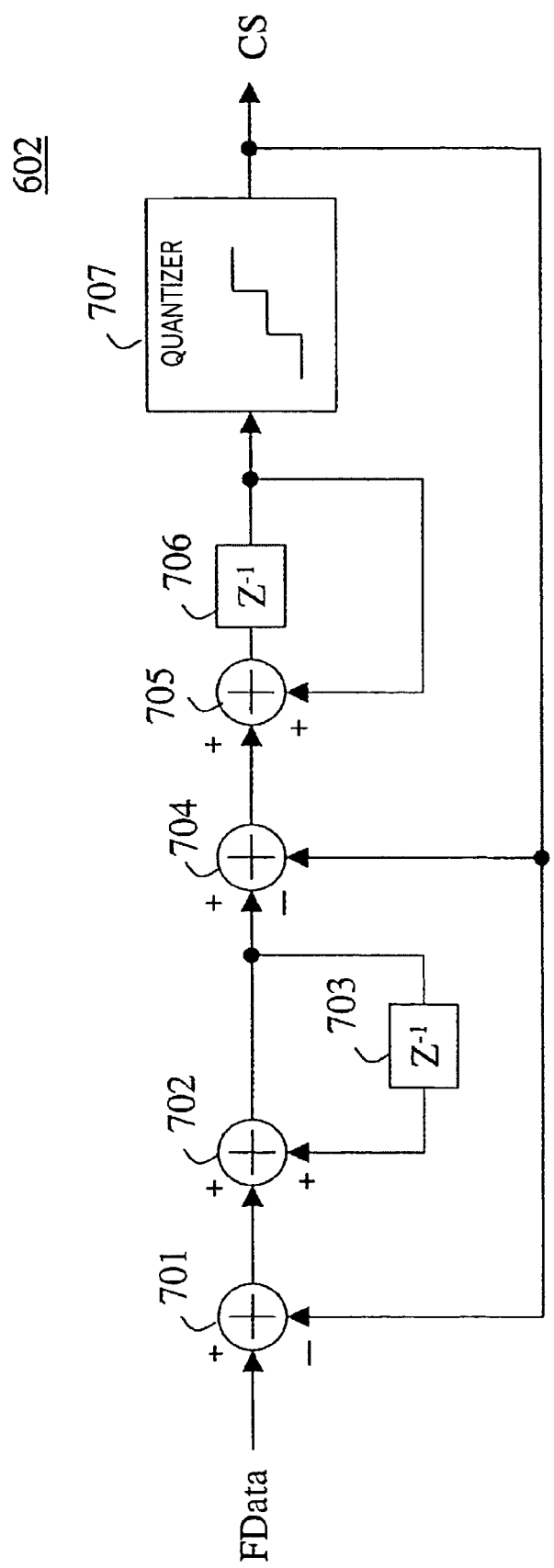
FIG. 15 is a block diagram showing a configuration of a three-valued ΔΣ modulator as shown in FIG. 11.

FIG. 15 shows the configuration of the three-valued $\Delta\Sigma$ modulator 602 as shown in FIG. 11. As shown in FIG. 15, this $\Delta\Sigma$ modulation circuit has a quadratic configuration, and has a first to fourth adders 701, 702, 704 and 705, delay circuits 703 and 706 and a three-valued quantizer 707. The three-valued quantizer 707 outputs one of the three values of $+\Delta$, 0, $-\Delta$ as the control signal CS in response to the input. With respect to the selection of clock signal, when three values are associated with "backward transition", "maintenance" and "forward transition", the frequencies of the modulated clock signals are controlled to be $f=f0\cdot 13/12$, $f=f0$ and $f=f0\cdot 11/12$, respectively.

According to the configuration as shown in FIG. 15, by inputting the value expressed by the following expression as the frequency data FData, the frequency of the modulated clock signal MCK can be controlled to be an arbitrary frequency f1.

Frequency data=$\Delta\times(f1-f0)/(f0/12)$ (5)

Note that, in place of the three-valued $\Delta\Sigma$ modulator as shown in FIG. 15, a one-bit $\Delta\Sigma$ modulator may be used. In this case, one bit is associated with two of "backward transition", "maintenance" and "forward transition".

Thus, frequency modulation can be realized by a simple configuration. Further, generally, when the pulse width of the change pump is large, the jitter of the PLL output tends to be larger. On the other hand, in the modulated clock signal generating circuit according to the embodiment, the phase of the clock signal for the feed back can be finely controlled by using the selector, and therefore, there is an advantage that the jitter is reduced.

According to the above-mentioned modulated clock signal generator according to the first embodiment of the present invention, modulated clock signals with no restriction on the phase valuable range can be generated and the EMI of electronic equipment can be reduced.

Figure 16:
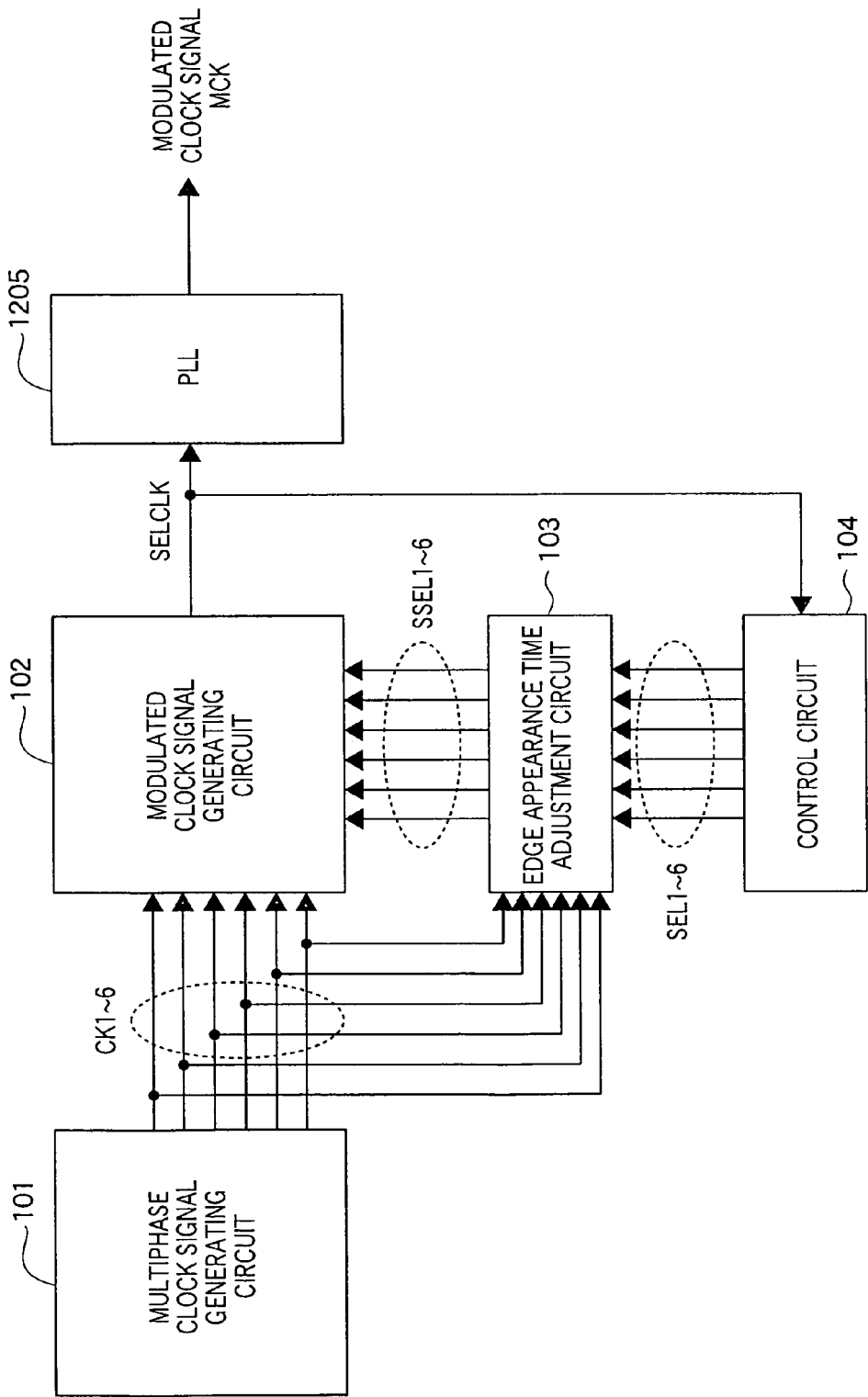
FIG. 16 is a block diagram showing a configuration of a phase-selective type frequency modulator according to a second embodiment of the present invention.
Figure 17:
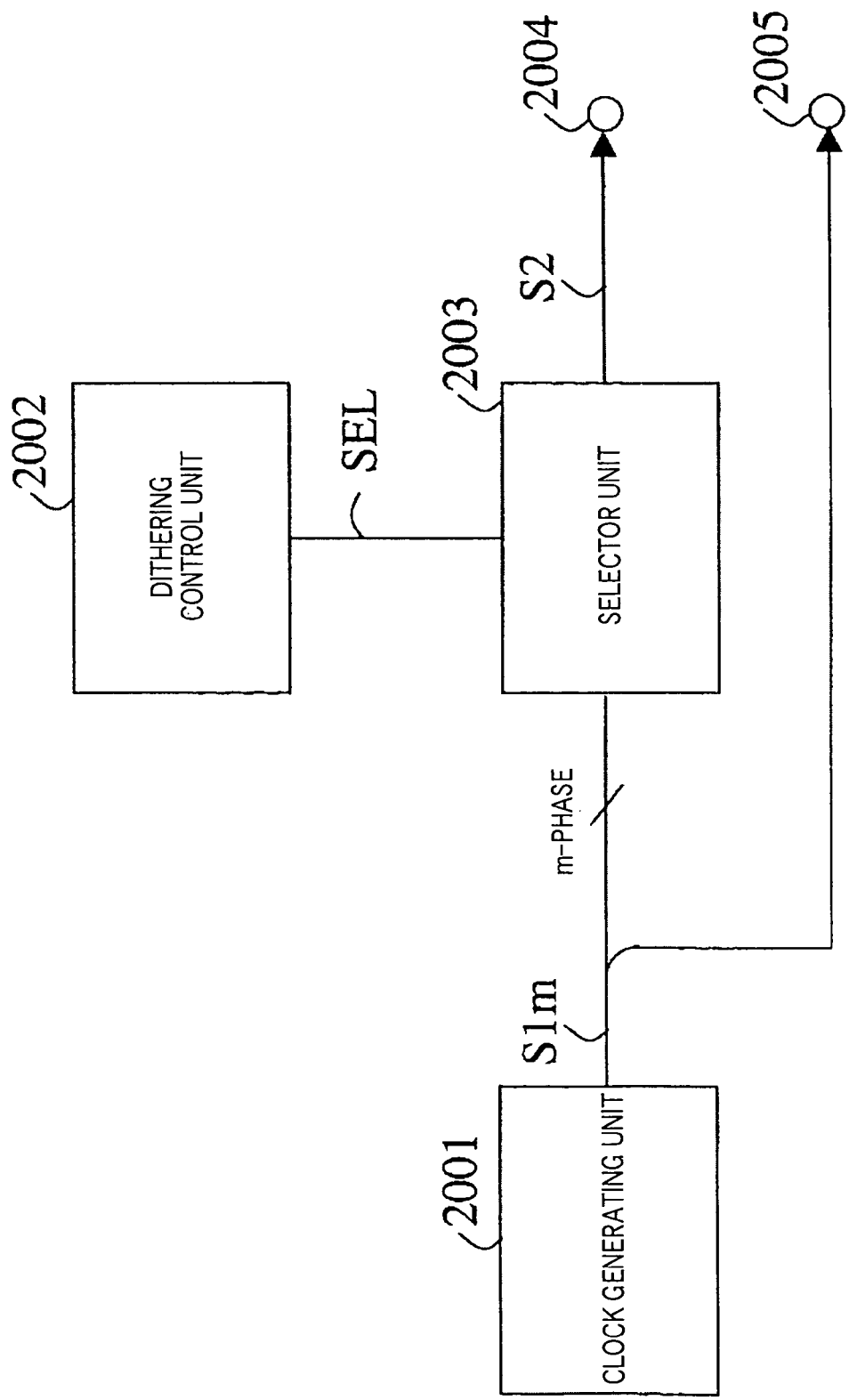
FIG. 17 is a block diagram showing a configuration of a conventional clock signal generator.
Figure 18:
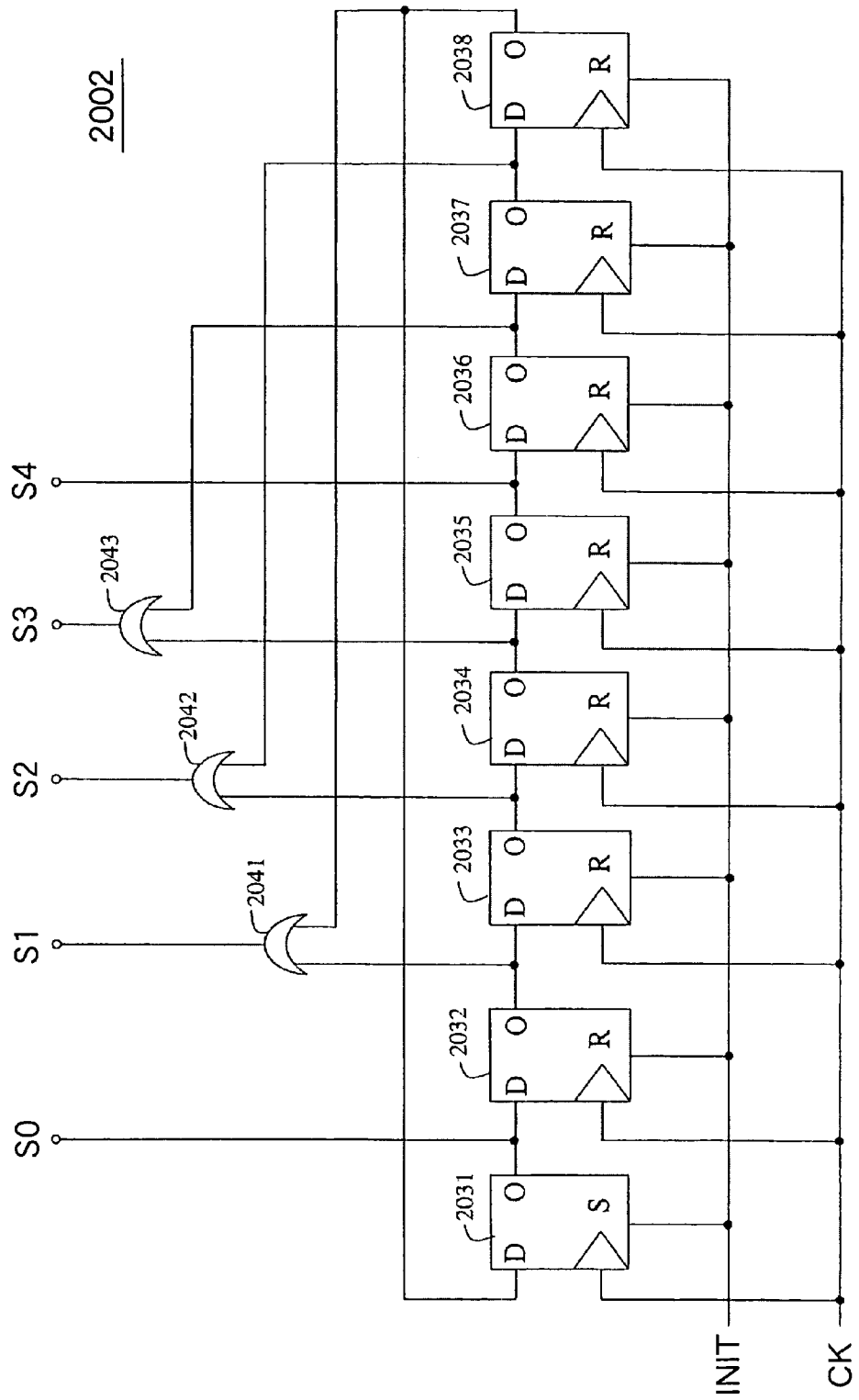
FIG. 18 is a block diagram showing a configuration example of a dithering control unit in FIG. 17.
Figure 19:
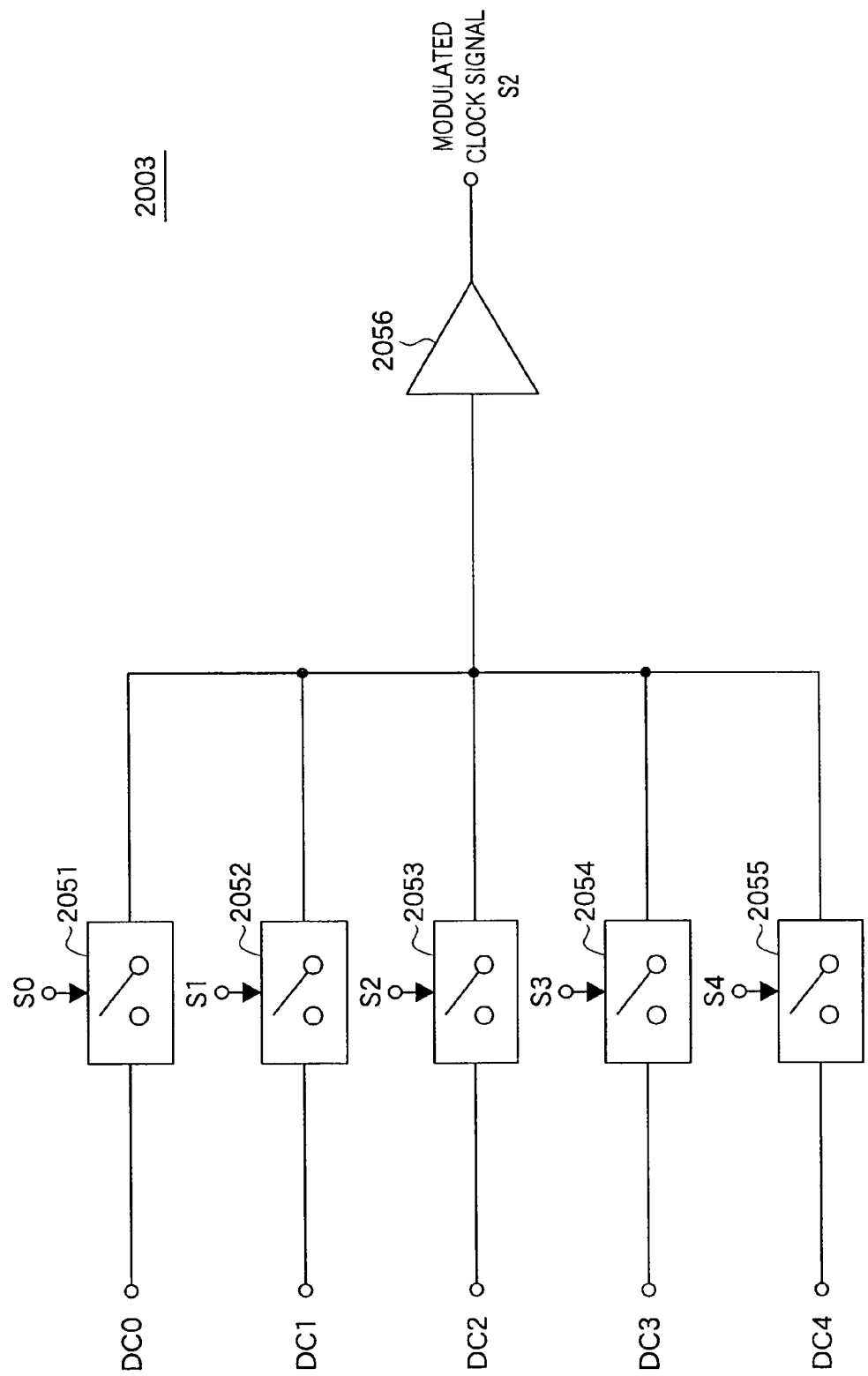
FIG. 19 is a block diagram showing a configuration of a selector unit in FIG. 17.
Figure 20:
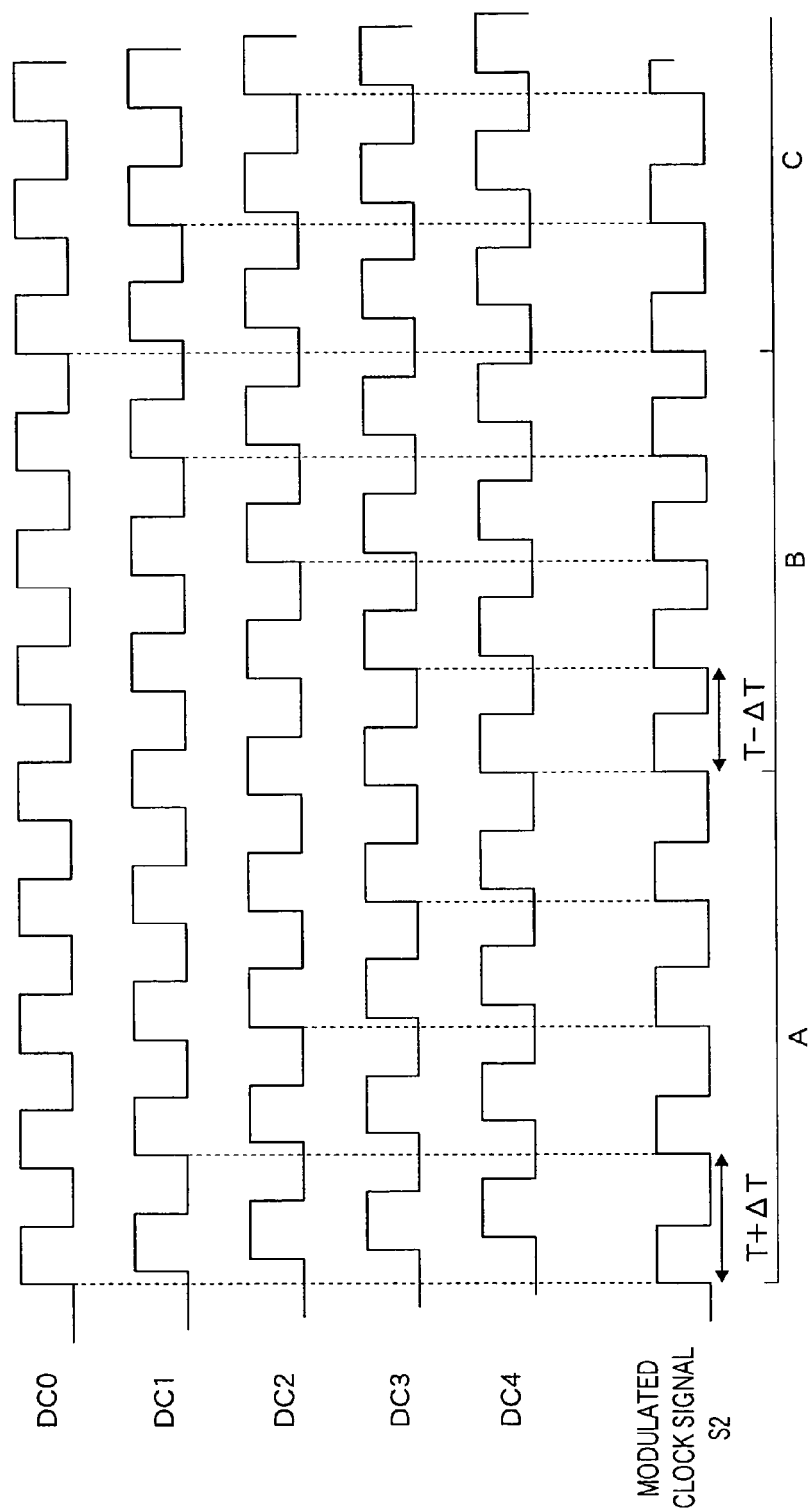
FIG. 20 is an operation waveform chart of the clock signal generator in FIG. 17.
Figure 21:
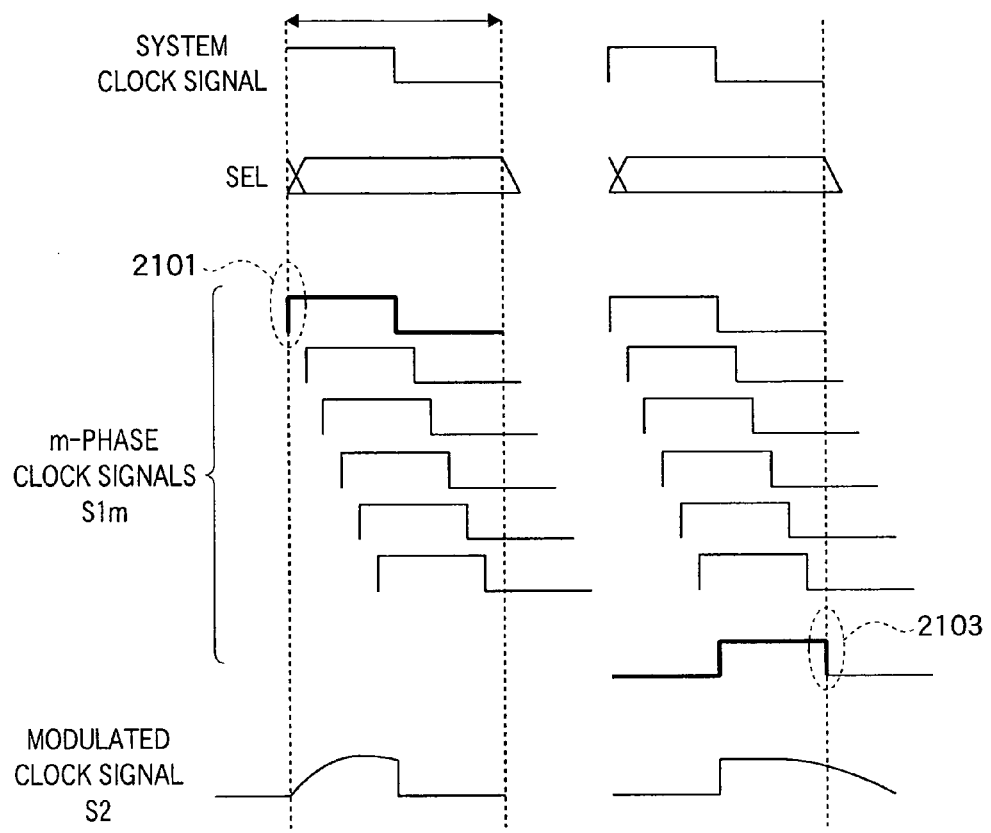
FIG. 21 is a diagram for explaining a problem of the clock signal generator in FIG. 17 in view of the operation waveform.
Figure 22A:
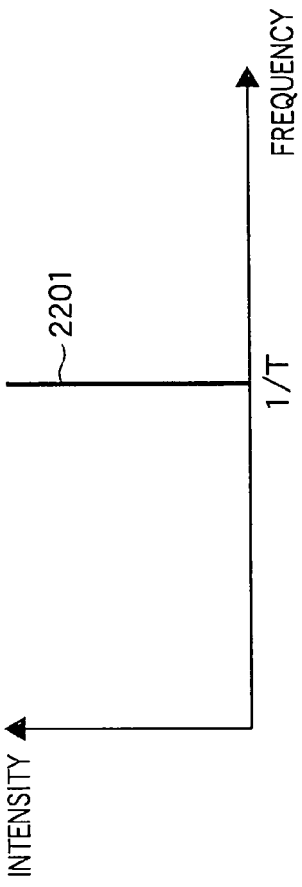
FIG. 22 is a diagram for explaining a problem of the clock signal generator in FIG. 17 in view of spectrum spread.
Figure 22B:
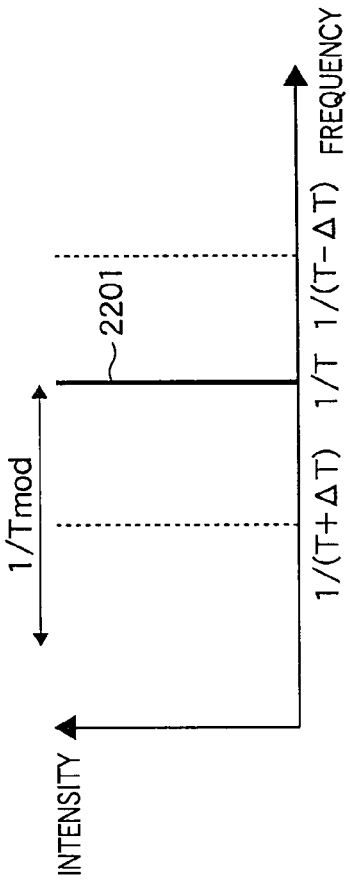
Figure 22C:
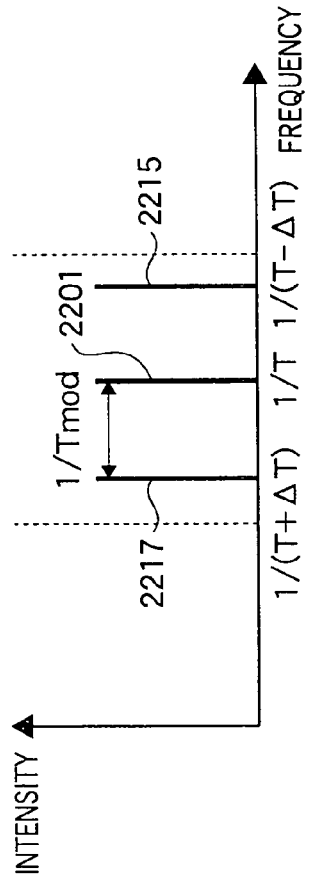

Next, a phase-selective type frequency modulator according to a second embodiment of the present invention will be described by referring to FIG. 16. As shown in FIG. 16, the phase-selective type frequency modulator according to the second embodiment has a multiphase clock signal generating circuit 101, a modulated clock signal generating circuit 102, an edge appearance time adjustment circuit 103 and a control circuit 104 as well as the phase-selective type frequency modulator according to the first embodiment as shown in FIG. 1. It differs from the circuit as shown in FIG. 1 in the point where a PLL 1205 is additionally connected to the output of the modulated clock signal generating circuit 102. In the embodiment, a modulated clock signal MCK is outputted from the PLL 1205. According to the embodiment, the discrete cyclic change in the selected clock signal SELCLK outputted from the modulated clock signal generating circuit 102 is filtered by a loop filter of the PLL 1205, and therefore, a modulated clock signal in which frequency change is mild can be obtained.

INDUSTRIAL APPLICABILITY

The present invention can be utilized in a phase-selective type frequency modulator and a phase-selective type frequency synthesizer to be used in electronic equipment for performing transmission of image data and so on.

The invention claimed is:

1. A phase-selective type frequency modulator comprising:
   multiphase clock signal generating means for generating N-phase clock signals having phase differences from each others;
   control means for sequentially activating one of first group of clock selection signals indicating a clock signal to be selected from the N-phase clock signals outputted from said multiphase clock signal generating means, said first group of clock selection signals corresponding to said N-phase clock signals;
   edge appearance time adjusting means for adjusting a rising edge appearance time and/or a trailing edge appearance time of the first group of clock selection signals outputted from said control means to output second group of clock selection signals corresponding to the N-phase clock signals outputted from said multiphase clock signal generating means; and
   modulated clock signal generating means for selecting one clock signal from said N-phase clock signals in accordance with an activated state of said second group of clock selection signals outputted from said edge appearance time adjusting means to output the selected clock signal as a modulated clock signal.

2. A phase-selective type frequency modulator according to claim 1, wherein said edge appearance time adjusting means adjusts the rising edge appearance time and/or the trailing edge appearance time of said first group of clock selection signals such that a rising edge appearance time and/or a trailing edge appearance time of the clock signal selected in accordance with the first clock selection signal activated by said selecting means and a rising edge appearance time and/or a trailing edge appearance time of said second group of clock selection signals may not overlap.

3. A phase-selective type frequency modulator comprising:
   multiphase clock signal generating means for generating N-phase clock signals having phase differences from each others;
   control means for sequentially activating one of first group of clock selection signals indicating a clock signal to be selected from the N-phase clock signals outputted from said multiphase clock signal generating means, said first group of clock selection signals corresponding to said N-phase clock signals;
   edge appearance time adjusting means for adjusting a rising edge appearance time and/or a trailing edge appearance time of the first group of clock selection signals outputted from said control means to output second group of clock selection signals corresponding to the N-phase clock signals outputted from said multiphase clock signal generating means;

modulated clock signal generating means for selecting one clock signal from said N-phase clock signals in accordance with an activated state of said second group of clock selection signals outputted from said edge appearance time adjusting means to output the selected clock signal; and PLL (phase locked loop) means for receiving the clock signal selected by said modulated clock signal generating means and filtering jitter in the selected clock signal to output a modulated clock signal.

4. A phase-selective type frequency modulator according to claim 3, wherein said edge appearance time adjusting means adjusts the rising edge appearance time and/or the trailing edge appearance time of said first group of clock selection signals such that a rising edge appearance time and/or a trailing edge appearance time of the clock signal selected in accordance with the first clock selection signal activated by said selecting means and a rising edge appearance time and/or a trailing edge appearance time of said second group of clock selection signals may not overlap.

5. A phase-selective type frequency synthesizer comprising:

control means for sequentially activating one of first group of clock selection signals indicating a clock signal to be selected from N-phase clock signals having phase differences from each others, said first group of clock selection signals corresponding to said N-phase clock signals;

edge appearance time adjusting means for adjusting a rising edge appearance time and/or a trailing edge appearance time of the first group of clock selection signals outputted from said control means to output second group of clock selection signals corresponding to said N-phase clock signals;

modulated clock signal generating means for selecting one clock signal from said N-phase clock signals in accordance with an activated state of said second group of clock selection signals outputted from said edge appearance time adjusting means to output the selected clock signal;

phase comparing means for comparing a phase of a reference clock signal and a phase of the clock signal selected by said modulated clock signal generating means; and multiphase clock signal generating means for generating said N-phase clock signals based on a comparison result in said phase comparing means and outputting one of said N-phase clock signals as a modulated clock signal.

6. A phase-selective type frequency synthesizer according to claim 5, further comprising dividing means for frequency-dividing the clock signal selected by said modulated clock signal generating means and outputting the frequency-divided clock signal to said phase comparing means.

* * * * *